(12) United States Patent
Dyer

(10) Patent No.: US 11,677,409 B2
(45) Date of Patent: Jun. 13, 2023

(54) CLOUD ASSISTED CALIBRATION OF ANALOG-TO-DIGITAL CONVERTERS

(71) Applicant: Microsoft Technology Licensing, LLC, Redmond, WA (US)

(72) Inventor: Kenneth Colin Dyer, Pleasanton, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 8 days.

(21) Appl. No.: 17/368,807

(22) Filed: Jul. 6, 2021

(65) Prior Publication Data

US 2022/0302921 A1    Sep. 22, 2022

Related U.S. Application Data

(63) Continuation-in-part of application No. 17/207,343, filed on Mar. 19, 2021, now Pat. No. 11,387,838.

(51) Int. Cl.
   *H03M 1/06* (2006.01)
   *G06K 9/62* (2022.01)
   (Continued)

(52) U.S. Cl.
   CPC ........ *H03M 1/0687* (2013.01); *G06K 9/6256* (2013.01); *G06N 3/04* (2013.01); *H03M 1/1052* (2013.01)

(58) Field of Classification Search
   CPC .... H03M 1/1215; H03M 1/12; H03M 1/0836; H03M 1/1038; H03M 1/00; H03M 1/06;
   (Continued)

(56) References Cited

U.S. PATENT DOCUMENTS

| 4,367,456 A | 1/1983 | Munter |
| 4,535,318 A | 8/1985 | Duryee et al. |

(Continued)

FOREIGN PATENT DOCUMENTS

| CN | 109584901 B | 4/2021 |
| EP | 2776788 B1 | 11/2019 |
| WO | 2010103332 A1 | 9/2010 |

OTHER PUBLICATIONS

Bansal, et al., "Neural-Network Based Self-Initializing Algorithm for Multi-Parameter Optimization of High-Speed ADCs", In Journal of IEEE Transactions on Circuits and Systems II: Express Briefs, vol. 68, Issue 1, Jan. 2021, pp. 106-110.

(Continued)

*Primary Examiner* — Linh V Nguyen
(74) *Attorney, Agent, or Firm* — Fountainhead Law Group PC

(57) ABSTRACT

Embodiments of the present disclosure includes systems and methods for diagnosing and correcting deficiencies in operation of integrated circuits. A set of operational data of an integrated circuit is received by a network via a communication interface. A deficiency in operation of the integrated circuit is diagnosed based on the set of operational data. A correction is generated for improving operation of the integrated circuit based on the deficiency diagnosed. The correction is transmitted over the network via the communication interface to the integrated circuit.

13 Claims, 19 Drawing Sheets

(51) Int. Cl.
*G06N 3/04* (2023.01)
*H03M 1/10* (2006.01)

(58) Field of Classification Search
CPC .. H03M 1/1033; H03M 1/1009; H03M 13/09; H03M 1/10; H03M 1/1042; H03M 1/1052; H03M 1/1225; H03M 3/38
USPC .................................. 341/118–120, 140–142
See application file for complete search history.

(56) References Cited

U.S. PATENT DOCUMENTS

| | | | |
|---|---|---|---|
| 6,081,215 A * | 6/2000 | Kost | H03M 1/1028 341/126 |
| 7,839,319 B2 | 11/2010 | Nittala et al. | |
| 8,138,790 B1 | 3/2012 | Doubler et al. | |
| 8,803,583 B2 | 8/2014 | Nedachi | |
| 8,907,827 B2 | 12/2014 | Basset et al. | |
| 8,936,754 B2 * | 1/2015 | Yamazaki | G01N 21/82 422/402 |
| 9,071,262 B1 * | 6/2015 | Malkin | H04B 17/21 |
| 9,106,249 B1 | 8/2015 | Dyer et al. | |
| 9,294,112 B1 * | 3/2016 | Devarajan | H03M 1/0836 |
| 9,484,945 B1 | 11/2016 | Wan et al. | |
| 9,485,039 B1 * | 11/2016 | Malkin | H04B 17/21 |
| 9,509,640 B2 | 11/2016 | Taylor et al. | |
| 9,680,492 B1 | 6/2017 | Farley et al. | |
| 9,998,134 B1 * | 6/2018 | Stepanovic | H03M 1/1014 |
| 10,014,875 B1 | 7/2018 | Zanikopoulos et al. | |
| 10,389,374 B1 | 8/2019 | Khoshgard et al. | |
| 10,454,488 B1 | 10/2019 | Monangi | |
| 10,454,492 B1 | 10/2019 | Shikata et al. | |
| 10,551,226 B2 | 2/2020 | Luo et al. | |
| 10,715,165 B2 | 7/2020 | Kurahashi et al. | |
| 10,763,879 B1 | 9/2020 | Neto | |
| 10,897,262 B2 | 1/2021 | Kesavanunnithan et al. | |
| 2010/0241930 A1 * | 9/2010 | Chang | H03M 13/2906 714/752 |
| 2012/0242520 A1 * | 9/2012 | Noguchi | H03M 1/0624 341/118 |
| 2013/0057424 A1 | 3/2013 | Jeon et al. | |
| 2015/0042500 A1 | 2/2015 | Fujiwara et al. | |
| 2015/0326240 A1 * | 11/2015 | Tousi | H03M 1/46 341/118 |
| 2016/0079994 A1 | 3/2016 | Lee et al. | |
| 2017/0093418 A1 | 3/2017 | Baek et al. | |
| 2017/0146375 A1 * | 5/2017 | Luo | G01D 18/008 |
| 2019/0074845 A1 | 3/2019 | Nakamura et al. | |
| 2019/0326919 A1 | 10/2019 | Pernull et al. | |
| 2021/0151120 A1 * | 5/2021 | Law | G11C 29/44 |
| 2022/0019883 A1 * | 1/2022 | Veldhoven | G06N 3/084 |

OTHER PUBLICATIONS

Bjorsell, et al., "A Statistical Evaluation of ADC Histogram Tests with Arbitrary Stimuli Signal", In Proceedings of 5th IEE International Conference on ADDA. Advanced A/D and D/A Conversion Techniques and their Applications, Jul. 25, 2005, 5 Pages.

"International Search Report and Written Opinion Issued in PCT Application No. PCT/US22/018820", dated Jun. 22, 2022, 12 Pages.

"International Search Report and Written Opinion Issued in PCT Application No. PCT/US22/019062", dated Jun. 23, 2022, 14 Pages.

Dimitrijevic, et al., "Remote Wireless Calibration of Equipment in the Distributed Measurement Systems", In 8th International Conference on Telecommunications in Modern Satellite, Cable and Broadcasting Services, Nov. 5, 2007, pp. 479-482.

"Understanding SAR ADCs: Their Architecture and Comparison with Other Adcs", Retrieved from: https://pdfserv.maximintegrated.com/en/an/AN1080.pdf, Oct. 2, 2001, 13 Pages.

"Non Final Office Action Issued in U.S. Appl. No. 17/207,343", dated Nov. 5, 2021, 13 Pages.

Chen et al., "40-Gb/s 0.7-V 2:1 MUX and 1:2 DEMUX with Transformer-Coupled Technique for SerDes Interface", In Journal of IEEE Transactions on Circuits and Systems I: Regular Papers, vol. 62, Issue 4, Apr. 2015, pp. 1042-1051.

"Notice of Allowance Issued in U.S. Appl. No. 17/207,343", dated Mar. 16, 2022, 8 Pages.

* cited by examiner

CLOUD ASSISTED CALIBRATION OF ANALOG-TO-DIGITAL CONVERTERS

BACKGROUND

The present disclosure relates to the calibration of circuitry and, more particularly, to the remote calibration of integrated circuits, such as analog-to-digital converters.

Integrated circuits (ICs) are used in most consumer electronic devices. Accurate and precise operation of the ICs is critical in some applications. For instance, in some medical equipment, the accuracy of an IC may affect a patient's outcome. Calibration of ICs is such devices may be performed routinely to ensure that the devices operate in a desired range.

An analog-to-digital converter ("ADC") is a particular example of circuitry that are implemented on ICs and used in a wide range of electronic applications. ADCs convert analog (continuous) signals into digital values representing such signals. The digital signals can then be processed digitally using digital circuits (e.g., logic circuits). In data communications application, ADCs may be used in receivers, where data is transmitted over an analog channel and converted to digital using an ADC in the receiver. Such ADCs are often required to provide accurate results at high frequencies. Accordingly, it is common for such systems to calibrate the ADCs performance for a particular communication channel (e.g., a wired or wireless channel). In some ADCs, errors can occur as the reference changes between discrete values, especially at very high speeds. If the reference has not settled to a new value during a conversion, for example, the comparison may be inaccurate and the resulting digital codes erroneous.

Some ICs may include circuitry to assist in calibration or diagnose on chip problems. However, such assistive circuitry occupies valuable space on a die and increases the cost of package. Calibrating circuits, such as ADCs, without assistive circuitry involves a substantial degree of knowledge and training. As a result, calibration may be performed by a technician or other skilled person, which increases the cost of maintenance of a device and can complicate operation of an associated system.

DETAILED DESCRIPTION

Disclosed herein are techniques for calibrating circuitry. In the following description, for purposes of explanation, numerous examples and specific details are set forth in order to provide a thorough understanding of the present disclosure. Such examples and details are not to be construed as unduly limiting the elements of the claims or the claimed subject matter as a whole. Those skilled in the art should understand, based on the language of the different claims, that the claimed subject matter may include some or all of the features in these examples, alone or in combination, and may further include modifications and equivalents of the features and techniques described herein. The term "set" (e.g., a set of keys), as used herein, refers to a non-empty collection of members.

Figure 1:
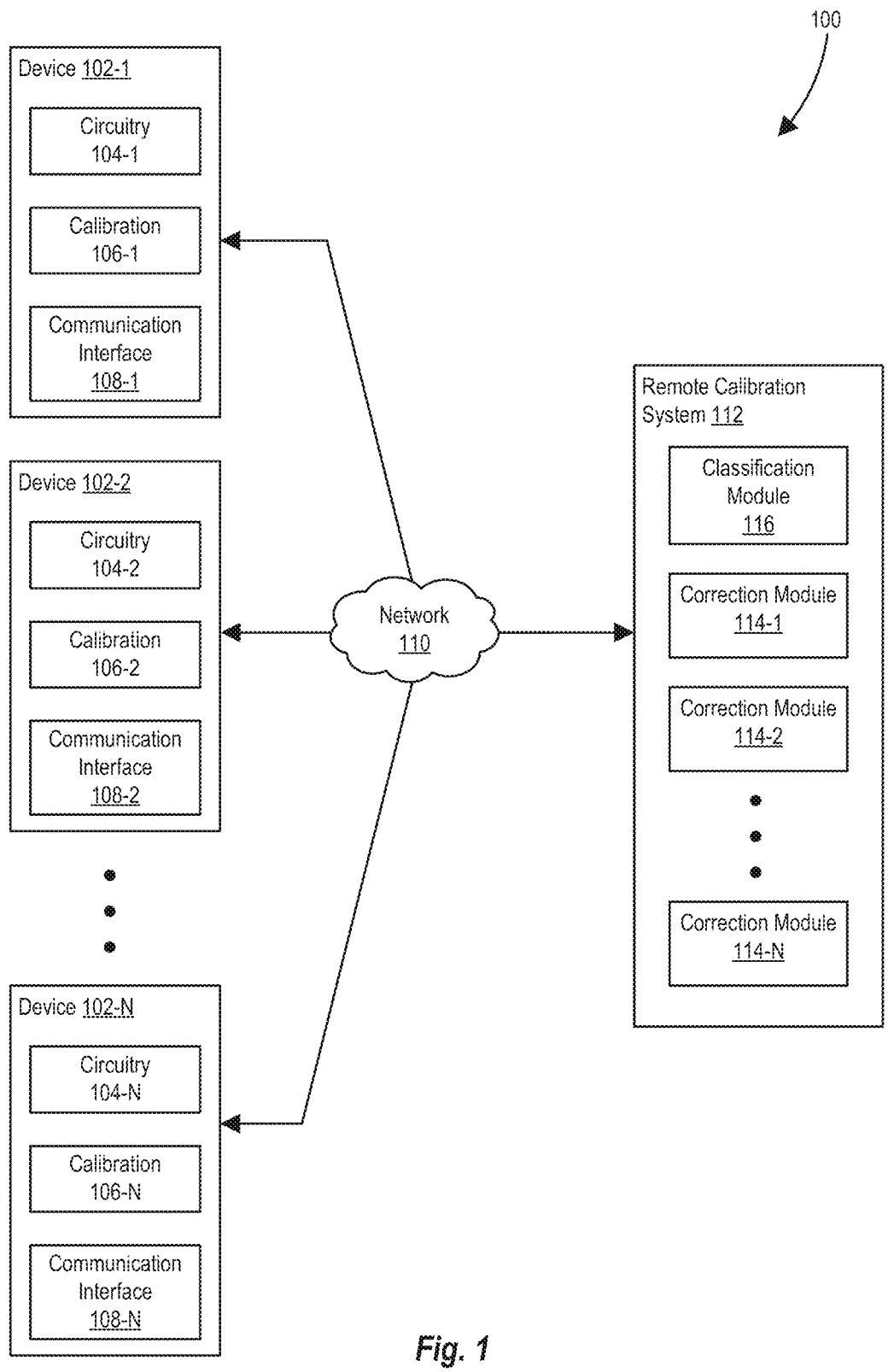
FIG. 1 illustrates an environment in which remote calibration of a plurality of circuits is performed over a network according to one or more embodiments.

FIG. 1 illustrates an environment 100 in which remote calibration of one or more circuits is performed over a network according to one or more embodiments. The environment 100 includes a set of devices 102-1, 102-2, . . . 102-N (collectively "the devices 102") each provided with integrated circuit 104-1, 104-2, . . . 104-N (collectively "integrated circuit 104") to be calibrated. Each of the devices 102 includes calibration circuitry 106-1, 106-2, . . . 106-N (collectively "calibration circuitry 106") configured to calibrate the integrated circuit 104-1, 104-2, . . . 104-N of the device 102-1, 102-2, . . . 102-N in which they are located. The calibration circuitry 106 may be a part of the associated integrated circuit 104 in some embodiments.

Each of the devices 102 also include a communication interface 108-1, 108-2, . . . 108-N (collectively "communication interfaces") that are configured to communicate over a network 110 with a remote calibration system 112. The communication interfaces 108 may include transmitters and/or receivers that communicate data according to one or more communication protocols. In some embodiments, the communication interfaces 108 are configured to wirelessly transmit and/or receive data. In some embodiments, the communication interfaces 108 are configured to transmit and/or receive data via a communication bus to an intermediary communication device that communicates over the network 110. The network 110 may include one or more local area networks, one or more wide area networks, and one or more cellular networks, by way of non-limiting example.

For an individual device of the devices 102, the calibration circuitry 106 is configured to collect information regarding operation of the integrated circuit 104 and the communication interface 108 of the device sends the information to the remote calibration system 112 over the network 110. The remote calibration system 112 processes the information received to determine whether operation of the associated device is deficient. As a result of determining that operation of the device is deficient, the remote calibration system 112 generates a correction to remediate the deficiency and sends the correction to the corresponding device. The calibration circuitry 106 of the corresponding device 102 receives the correction via the communication interface 108 and appropriately calibrates the integrated circuit 104 based on the correction received. The configuration of the environment 100 enables remote calibration of the integrated circuit 104 without involving a technician or other skilled person. Moreover, the size or complexity of the calibration circuitry 106 may be reduced by offloading calibration analytics onto the remote calibration system 112, which may in turn reduce the size or footprint of the associated integrated circuit 104.

The calibration circuitry 106 includes one or more processors and encoded logic that causes the calibration circuitry 106 to perform as described herein. The encoded logic may include hardwired logic (e.g., logic gates), software, or a combination thereof. In some embodiments, the calibration circuitry 106 may include computer-readable program instructions that, as a result of execution by the one or more processors, cause the calibration circuitry 106 to perform as described herein.

One of the integrated circuits 104 may be different than another of the integrated circuit 104 in some embodiments. For instance, the integrated circuit 104-1 may be a first type of converter and the integrated circuit 104-2 may be a second type of converter that is different than the first type. As a more particular non-limiting example, the integrated circuit 104-1 may be an ADC and the device 102-2 may be a digital-to-analog converter ("DAC"). In some embodiments, two or more of the integrated circuits 104 may be of the same type, but have a different architecture. For instance, the integrated circuit 104-1 may be a successive approximation register ("SAR") ADC and the integrated circuit 104-2 may be a direct-conversion ADC (e.g., SAR ADCs, flash ADC, pipeline ADC) or an indirect-conversion ADC (e.g., dual-slope ADCs, sigma-delta ADCs). The remote calibration system 112 may calibrate other types of integrated circuits as well, including voltage references, data converters (e.g., digital potentiometers), radio-frequency integrated circuits, circuitry associated with on-chip sensors, and power electronics, by way of non-limiting example.

The calibration circuitry 106 may include data storage (e.g., read-only memory) storing classification information regarding the associated integrated circuit 114 and may be configured to provide the classification information in association with or as a part of the operational data to the remote calibration system 112. The classification information may include information regarding the type, the architecture, the serial number, etc., of the associated integrated circuit 114. In some embodiments, the calibration circuitry 106 may provide information regarding the operational data, such as information identifying the operational data as including an output of the integrated circuit 114 (e.g., voltage output, current output), timing information of the integrated circuit 114 (e.g., phase, clock, synchronization), or setting information of the integrated circuit 114 (e.g., gain, offset). In some embodiments, the calibration circuitry 106 may provide error-related information, such as the bit error rate (BER) of the integrated circuit 104 or information regarding specific errors in the integrated circuit 104. The classification information includes, in some embodiments, network information regarding a network location of the device 102, such as an internet protocol (IP) address, a uniform resource identifier (URI), or a Bluetooth address, by way of non-limiting example.

The remote calibration system 112 may include a plurality of calibration modules 114-1, 114-2, . . . 114-N (collectively "calibration modules 114") that are configured to analyze the operational data of the integrated circuits 104 and determine one or more corrections to be implemented as a result of detecting an operational deficiency. Each of the calibration modules 114 may be configured to detect and correct deficiencies in specific types and/or architectures of the integrated circuits 114. For instance, the correction module 114-1 may be configured to process operational data for one or more types ADCs whereas the correction module 114-2 may be configured to process operational data for DACs. As another non-limiting example, the correction module 114-1 may be configured to process operational data for SAR ADCs whereas the correction module 114-2 may be configured to process operational data for direct-conversion or indirect-conversion ADCs. As yet a further non-limiting example, the correction module 114-1 may be configured to process operational data for SAR ADCs of a particular configuration whereas the correction module 114-2 may be configured to process operational data for SAR ADCs of a different configuration.

The remote calibration system 112 may include a classification module 116 that is configured to classify the operational data and route the operational data to a particular calibration module of the calibration modules 114 based on the classification. More particularly, the classification module 116 may process the classification information provided by the calibration circuitry 106; determine the type, architecture, etc., of the associated circuitry 104; and route the operational data based on the determination regarding the associated circuitry 104. As a non-limiting example, the classification module 116 may receive classification information and operational data from the calibration circuitry 106-1 and determine that the integrated circuit 104-1 is an SAR ADC and that the operational data includes output voltage information. As a result, the classification module 116 may route the classification information and operational data to the correction module 114-1, which is specifically configured to diagnose and correct deficiencies in operation of SAR ADCs. The classification module 116 may receive, from the correction module 114-1, correction information and transmit the correction information to the correction module 114-1 over the network based on the classification information.

The remote calibration system 112 includes one or more processors and memory (e.g., read-only memory, random access memory) storing computer-readable executable program instructions that, as a result of execution by the one or more processors, cause the remote calibration system 112 to perform as described herein. The term "module," as referred to herein refers to a collection of hardware and software that, in operation, is configured for a particular set of applications, such as classifying and routing operational data, or diagnosing and correcting operational deficiencies in the integrated circuits 104. The correction modules 114 may each include one or more neural network models that are trained to diagnose and correct deficiencies in the integrated circuits 104, as described in further detail infra.

Figure 2:
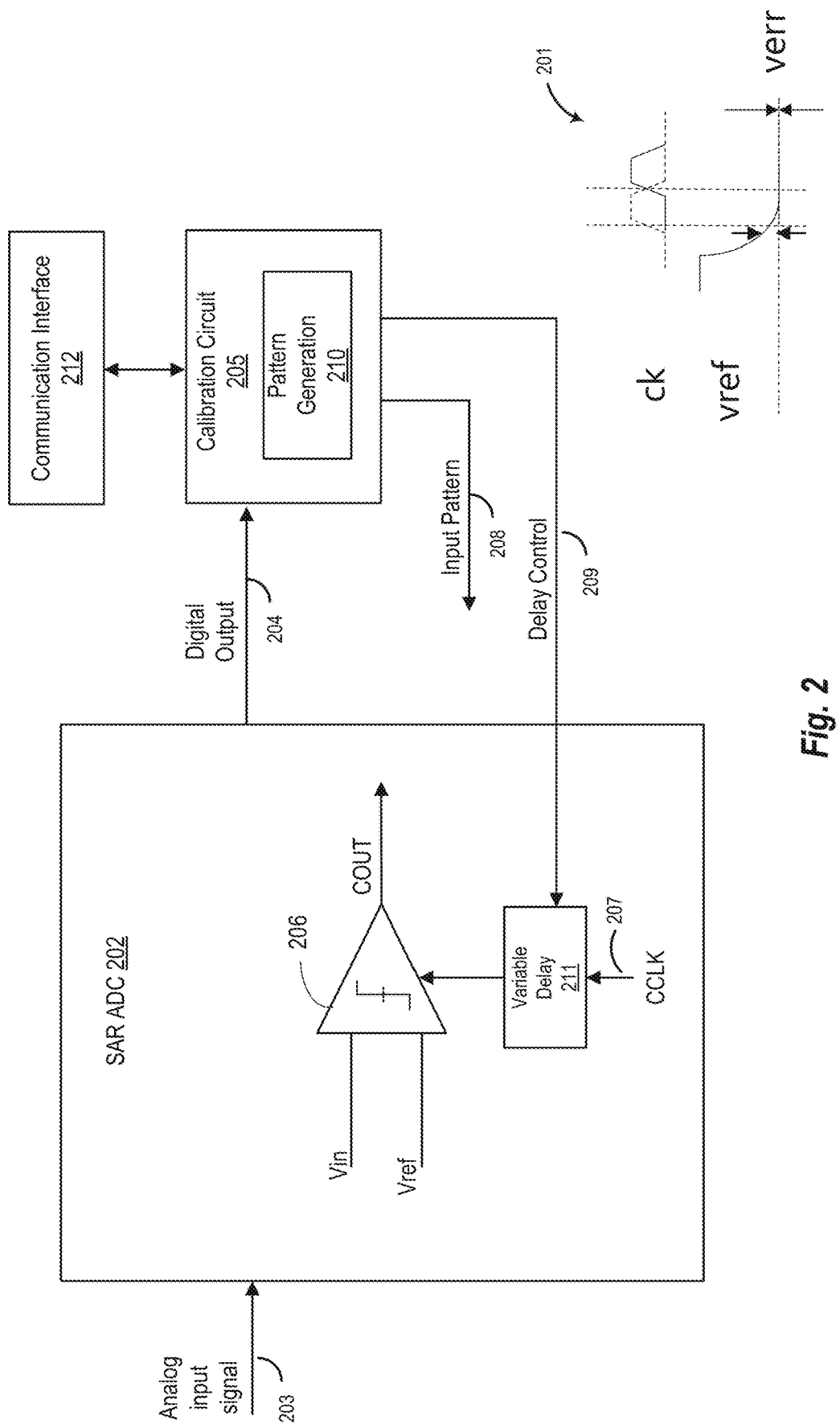
FIG. 2 illustrates a first non-limiting example of an integrated circuit according to one or more embodiments.

FIG. 2 illustrates a first non-limiting example of an integrated circuit 200 that may be included in the integrated circuits 104 of FIG. 1. The circuit 200 includes a successive approximation register analog-to-digital converter according to an embodiment. In this example, an SAR ADC 202 is configured to receive an analog input signal 203 and to generate a digital output code 204 corresponding to the analog input signal 203. SAR ADC 202 includes at least one comparator 206, which may have a first input coupled to receive an input voltage (e.g., from a sample and hold circuit, not shown) and a second input coupled to a reference voltage, Vref. SAR ADC 202 is used to generate the digital output code 204 in response to Vin. In this example, comparator 206 is coupled to a comparator clock (CCLK) signal 207 through a variable delay circuit 211. Circuit 200 further includes a calibration circuit 205 coupled to SAR ADC 202. Calibration circuit 205 provides an input signal pattern 208 across a range of analog input signal values to the SAR ADC 202. Pattern 208 may be generated by a pattern generator 210, for example. Pattern 208 may be coupled to the input 203, for example, during calibration. One example pattern may be a sinusoidal input (e.g., a sine wave, a cosine wave). Another example that may be useful in some wired data communications systems is a pulse amplitude modulated (PAM) signal, such as PAM4, for example. It is to be understood that a variety of patterns may be used in various embodiments.

In response to the pattern 208, SAR ADC 202 generates digital output codes (e.g., digital values representing different levels of the input signal at a particular point in time). A plurality of counts of the digital output codes are generated across the range of analog input signal values in the pattern and using the counts to reduce or eliminate errors in SAR ADC 202. For example, errors in the counts may be detected and used to adjust the delay 211 of the comparator clock (CCLK) signal 207 to reduce the errors in the plurality of counts. A plot of the clock signal delay and Vref is illustrated at 201. As mentioned above, Vref may be the output of a DAC and may change over time. As Vref changes there may be a time delay before Vref settles to a new voltage. If the comparator clock is early, there may be an error, Verr, in Vref because Vref has not settled to a final value. This error may show up as distortions in the number of counts for corresponding digital output codes, for example. As illustrated at 201, delaying the comparator clock reduces Verr and results in a more accurate conversion. More specifically, in this example Vref may have a settling time relating to an exponential decay (e.g., with a time constant "tau"). Accordingly, the voltage error, Verr, may be expressed as follows:

$$Verr(t) = Vo * e^{-Ts/tau}$$

where Ts is the time between the change in Vref and the comparison (e.g., the clock edge triggering the comparator) and Vo is a total change in Vref.

The calibration circuit 205 is communicatively coupled to a communication interface 212 that is configured to communicate information regarding operation of the SAR ADC 202 with the remote calibration system 112. The calibration circuit 205 may, by way of non-limiting example, provide operational data indicating that one or more delays are associated with operation of the SAR ADC 202. A corresponding correction module of the correction modules 114 receives the operational data and identifies the delay present in the operational data corresponding to the plot 201 as corresponding to a deficiency in operation of the SAR ADC 202.

In some embodiments, the calibration circuit 205 may send signals to the SAR ADC 202 to correct nonlinearity deficiencies. In some embodiments, the signals to the SAR ADC 202 to correct nonlinearity deficiencies may be signals to delay timings in operations, such as delaying the CCLK signal 207. In some embodiments, the calibration circuit 205 may send control signals to adjust DC voltage levels or send DAC codes for adjusting gains and/or offsets.

The correction module determines a correction and sends information corresponding to the correction to the communication interface 212, which provides the correction information to the calibration circuit 205. The correction information, for instance, may specify that a delay to be implemented to correct the deficiency. The calibration circuit 205 introduces the correction to the SAR ADC 202, which improves operation of the SAR ADC. The correction information may specify to increase Ts (e.g., delaying the clock edge), which causes the error, Verr, to decrease. Accordingly, increasing the delay can reduce the settling time error shown at 201. The reduction in Verr translates into the number of counts for the previously distorted bins being closer to an ideal number for the given pattern used. The result is that errors relating to particular analog input voltages and corresponding digital codes may be reduced or eliminated, for example.

Figure 3:
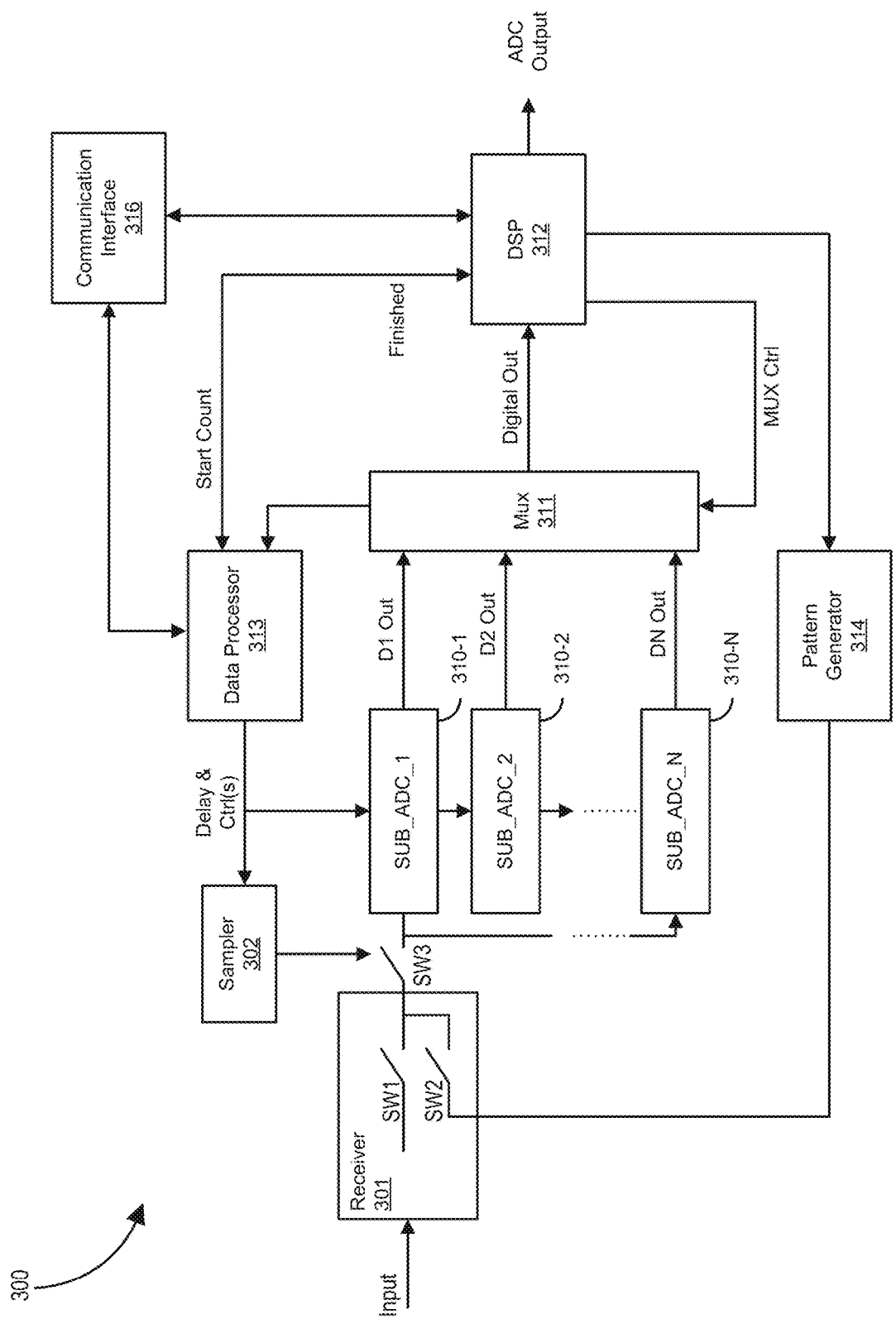
FIG. 3 illustrates a second non-limiting example of an integrated circuit according to one or more embodiments.

FIG. 3 illustrates a second non-limiting example circuit 300 that may be included in the integrated circuits 104 according to one or more embodiments. The circuit 300 includes a serializer/deserializer (SERDES) having a plurality of SAR ADCs 310-1, 310-2, ... 310-N (collectively "sub-ADCs") according to one or more embodiments. In this application, a receiver may include a receiver front end (FE) 301, coupled to a data channel, and a plurality of SAR ADCs 310(1)-(N) configured in parallel, each including the at least one comparator. SAR ADCs 310(1)-(N) receive and translate analog signals into digital codes, D1-DN, at very high speeds and may be considered as one ADC, where each block is sub-ADC, for example. In this example, there are N (an integer) sub-ADCs (SUB-ADC_1-SUB-ADC_N), each capable of generating digital output codes D1-DN across the full range of input values. Calibration may be occasionally performed on the sub-ADCs 310 to maintain sufficient operational precision and/or accuracy.

The circuit 300 includes a communication interface 316 that is configured to communicate information regarding operation of the circuit 300, including operation of the sub-ADCs 310 of the SERDES. The communication interface 316 may, by way of non-limiting example, provide operational data indicating that one or more delays are associated with operation of the SERDES. A corresponding correction module of the correction modules 114 receives the operational data and may diagnose one or more deficiencies in operation of the SERDES as well as corresponding corrections to be implemented.

During a calibration phase (or calibration mode), switch SW1 is open and switch SW2 is closed and a pattern is coupled from pattern generator 314 to the inputs of the SAR ADCs 310(1)-(N). Concerted operation of the sampler 302 and switch SW3 perform a sample and hold function in this non-limiting example. The pattern from the pattern generator 314 may be applied to each of the SAR ADCs 310(1)-(N) to generate a plurality of data sets. The digital output codes for each ADC may be coupled through a multiplexer 311 to a data processor 313 configured to collect data for the sub-ADCs 310. The data processor 313 may be a dedicated digital circuit, a local digital processor, or even an external process running on an external server, for example. The data processor 313 may implement certain corrections on the sub-ADCs 310 as indicated by corrections provided by one of the correction modules 314. For instance, the data processor 313 may implement corrections that remediate mismatches between the sub-ADCs 310.

The data processor 313 may provide signals to control operation of the sampler 302 and/or the sub-ADCs 310. The data processor 313, in some embodiments, may send signals to the sampler 302 to adjust phases of the sub-ADCs 310 via the switch SW3. The data processor 313 may send signals to delay or adjust timing of the sub-ADC 310 outputs. For instance, the signals to the sampler 302 and/or the sub-ADCs 310 may adjust quadrature synchronization of one or more of the sub-ADCs 310 relative to other sub-ADCs 310. In some embodiments, the data processor 312 may send signals to the sub-ADCs 310 to adjust other operational aspects, such as voltage output levels, DAC codes, etc.

The circuit 300 further includes a digital signal processor (DSP) 312 that controls aspects of calibration. For instance, the DSP 312 may signal the pattern generator 314 to send a pattern, signal the MUX 311 to route digital codes to the data processor 313, and signal the data processor 313 to start the count. In some embodiments, the DSP 312 may implement non-linearity corrections provided by one of the correction modules 114.

The communication interface 316 may receive corrections from the corresponding correction module and provide correction information to the data processor 313 and/or the DSP 312, which implement the corrections provided to improve operation of the SERDES. For instance, the corrections provided may adjust delays of the SERDES, and the data processor 313 may send a finished signal indicating completion of a calibration process. Once the SERDES is calibrated, the switch SW2 is opened, the switch SW1 is closed, and the outputs of the sub-ADCs 310 may be coupled through DSP 312 for further analysis.

Figure 4:
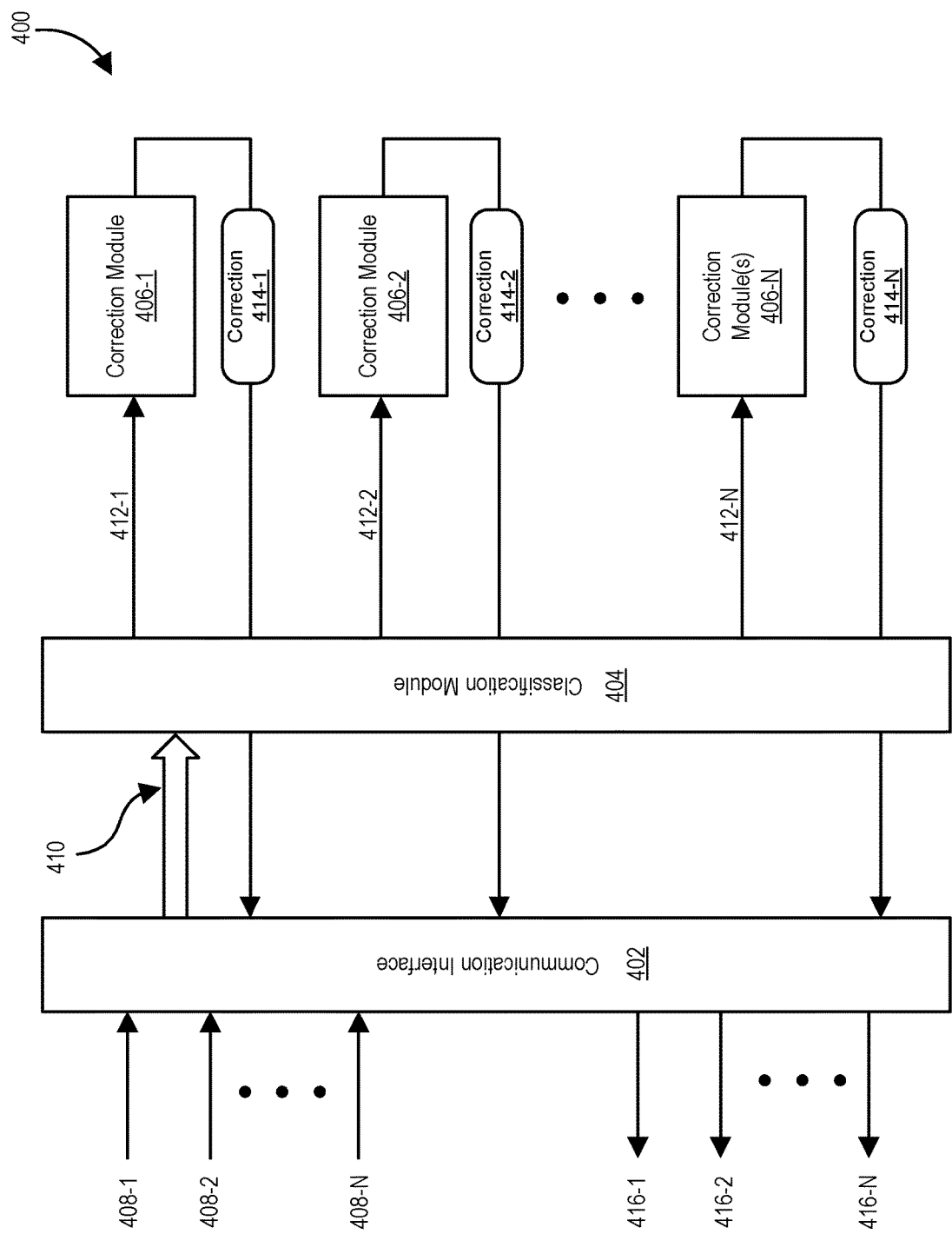
FIG. 4 illustrates a remote calibration system according to one or more embodiments.

FIG. 4 illustrates a remote calibration system 400 according to one or more embodiments. The remote calibration system 400 includes a communication interface 402, a classification module 404, and a set of correction modules 406-1, 406-2, . . . 406-N (collectively "correction modules 406"). The communication interface 402 receives a plurality of data sets 408-1, 408-2, . . . 408-N (collectively "data sets 408") that each include data regarding operation of an integrated circuit 104. Each of the data sets 408 may be correlated over time (e.g., include associated data specifying a time for each data point) and may include or be associated with classification information identifying the integrated circuit 104 from which the data set 408 was obtained.

The communication interface 402 processes the data sets 408 according to one or more communication protocols and extracts operational data associated with the integrate circuits 104 (see FIG. 1). For instance, the communication interface 402 may process the data sets 408 according to a particular communication protocol to generate extracted data 410. Non-limiting examples of such protocols includes internet protocol version 4 (IPv4), internet protocol version 6 (IPv6), Bluetooth protocol, Constrained Application Protocol, and Message Queuing Telemetry Transport protocol. The communication interface 402 may provide the extracted data 410 to the classification module 404. The extracted data 410 includes classification information identifying the integrated circuit 104 (e.g., type of the integrated circuit 104, architecture of the integrated circuit 104, serial number of the integrated circuit 104) and operational data of the integrated circuit 104.

The classification module 404 receives the extracted data 410 and determines which of the correction modules 406 to route the extracted data 410 to based on the classification information. By way of non-limiting example, the classification module 410 may route the extracted data 410 based on the type of integrated circuit 104 to which the extracted data 410 corresponds or based on the architecture of integrated circuit 104 to which the extracted data 410 corresponds. In some implementations, the extracted data 410 may include information unique to the corresponding integrated circuit 104, such as a serial number of the integrated circuit 104. The classification module 404 may include memory storing a data structure, such as a lookup table or a database, that is useable to determine where to route the extracted data 410.

Each of the correction modules 406 may be configured to diagnose and correct deficiencies for a specific class of integrated circuits 104. In some implementations, some of the correction modules 406 may be configured to diagnose and correct deficiencies for a specific type of integrated circuit 104—for example, the correction module 406-1 may be configured to analyze operational data of ADCs whereas the correction module 406-2 may be configured to analyze operational data of DACs. In some implementations, some of the correction modules 406 may be configured to diagnose and correct deficiencies for different architectures on the same type of integrated circuit 104. The correction module 406-1 may be configured to analyze operational data for SAR ADCs whereas the correction module 406-2 may be configured to analyze operational data for direct-conversion ADCs. In some implementations, some of the correction modules 406 may be configured to diagnose and correct specific deficiencies or diagnose and correct deficiencies of subcircuits of the integrated circuits 104. By way of non-limiting example, the correction module 406-1 may be configured to analyze operational data for static nonlinearity deficiencies and the correction module 406-2 may be configured to analyze operational data for dynamic mismatch deficiencies.

The classification module 404 routes operational data 412-1 of a first type to a correction module 406-1, operational data 412-2 of a second type to a correction module 406-2, etc., for diagnosis of potential deficiencies in operation of the corresponding integrated circuits 104. The operational data routed to each of the correction modules 406 includes information regarding the specific integrated circuit 104 or device 102 from which the data was obtained. As a result of diagnosing a deficiency in operation of one or more of the integrated circuits 104, the correction modules 406-1, 406-2, ... 406-N respectively generate corrections 414-1, 414-2, ... 414-N (collectively "corrections 414") to correct or modify operation of the corresponding integrated circuits 104. The corrections 414 are provided to the communication interface 402, which transmits correction data 416-1, 416-2, ... 416-N (collectively "correction data 416") back to the corresponding integrated circuits 104 based on classification information included in or associated with the corrections 414. For instance, the communication interface 402 may transmit the correction data 416 over the network 110 to IP addresses in headers of the data sets 408. The calibration circuits 106 of the corresponding devices 102 receive the correction data 416 and implement the corrections 414 on the integrated circuits 104 to improve operation thereof.

The remote calibration system 400 can communicate with the devices 102 to perform foreground calibration or background calibration. In foreground calibration, normal operation of the integrated circuit 104 (e.g., SAR ADC 202, circuit 300) may be discontinued to diagnose and correct deficiencies in operation. For instance, the circuit 300 may be controlled, either remotely by the remote calibration system 400 or by local control, to open switch SW1, close switch SW2, and operate the pattern generator 314 to provide a known waveform as an input to the sub-ADCs 310. The remote calibration system 400 analyzes operational data of the circuit 300 and provides corrections to the circuit for correcting any deficiencies. As a result of the corrections being implemented in the circuit 300, the circuit 300 may resume normal operation by operating the switch SW1 to be closed, the switch SW2 to be open, and providing user input to the receiver 301. In some implementations, the known waveform may be provided via the input wherein the switch SW1 is closed and the switch SW2 is open.

In background calibration, the operation of the integrated circuit 104 (e.g., SAR ADC 202, circuit 300) is briefly discontinued to diagnose and correct deficiencies in operation. More specifically, the circuit 300 may be controlled, either remotely by the remote calibration system 400 or by local control, to open switch SW1, close switch SW2, and operate the pattern generator 314 to provide a known waveform as an input to the sub-ADCs 310. Operational data corresponding to the known waveform is collected and sent via the communication interface 316 to the remote calibration system 400. Subsequent to collection and transmission of the operational data, normal operation of the circuit 300 is resumed by opening the switch SW2, closing the switch SW1, and providing user input in the receiver 301. The communication interface 316 receives and implements corrections specified in the correction data 416 without discontinuation or significant disruption of input data processing.

Figure 5:
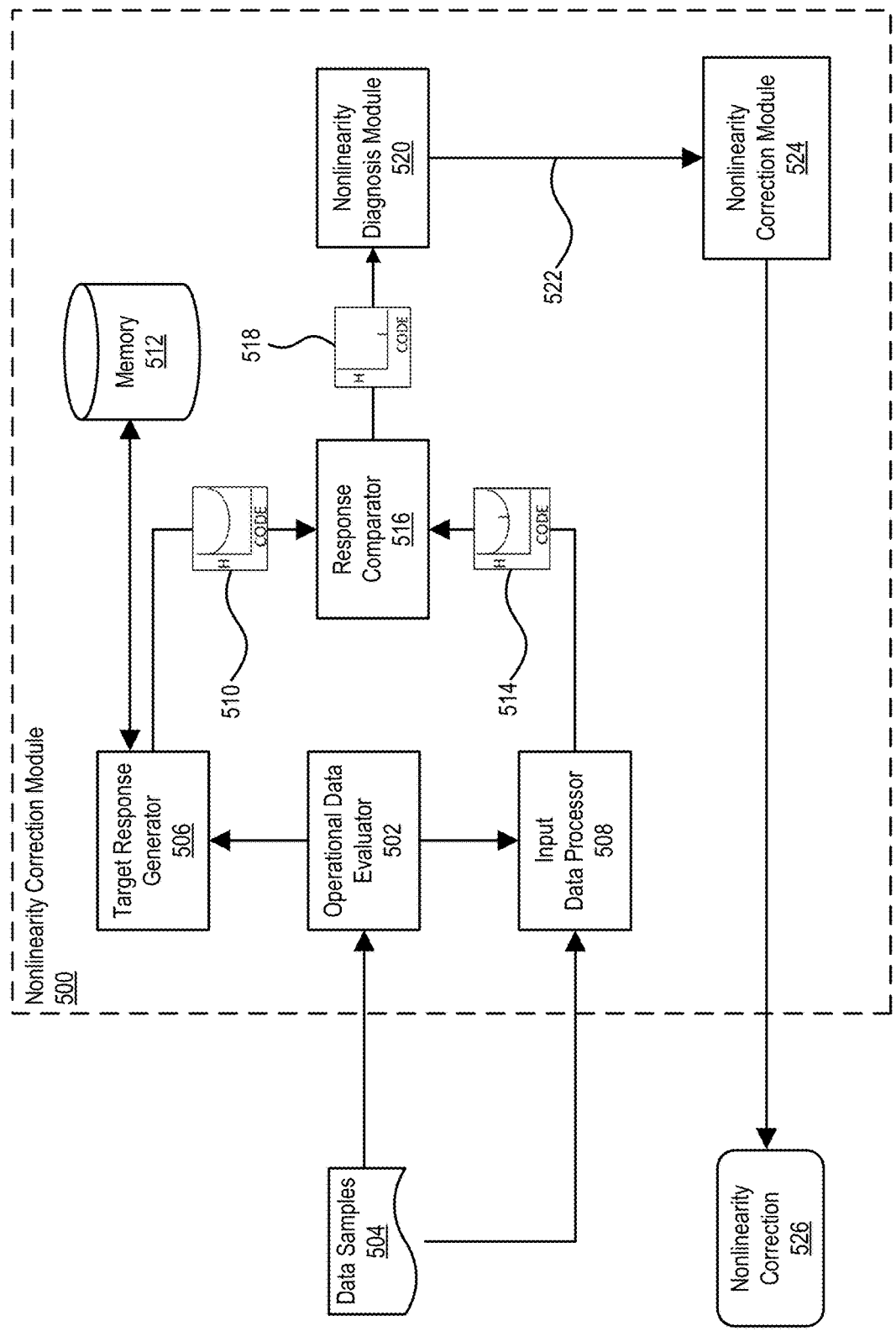
FIG. 5 illustrates a nonlinearity correction module of the remote calibration system of FIG. 4 according to one or more embodiments.

FIG. 5 shows a static nonlinearity correction module 500 according to one or more embodiments. The nonlinearity correction module 500 is, in some embodiments, one of the correction modules 406 discussed with respect to FIG. 4 and elsewhere herein. The nonlinearity correction module 500 is configured to diagnose and correct nonlinearities in some integrated circuits, such as ADCs. The nonlinearity correction module 500 is, in some embodiments, implemented as hardware, software, or a combination thereof.

The nonlinearity correction module 500 includes an operational data evaluator 502 that receives a collection of data samples 504 captured at one or more nodes in an integrated circuit. As a particular example, the data samples 504 may include a plurality of data points captured over time at the ADC output node of the DSP 312 in FIG. 3. The operational data evaluator 502 evaluates the data samples 504 to determine whether there are issues with the data samples 504 that would inhibit the diagnosis of any deficiencies therein. For example, the operational data evaluator 502 may detect whether there is clipping or other faults in the data samples 504, whether there are a sufficient number of data points to perform a meaningful diagnosis, and so on. The operational data evaluator 502 may also determine the bit-error rate and/or the status of the receiver 301 using the data samples 504.

The nonlinearity correction module 500 also includes a target response generator 506 and an input data processor 508 that are coupled to the operational data evaluator 502. As a result of a determination that the characteristics of the data samples 504 are sufficient to allow a meaningful diagnosis of the corresponding integrated circuit, the operational data evaluator 502 may initiate the target response generator 506 and the input data processor 508 to perform their respective operations. More particularly, the target response generator 506 generates a target response 510 of the corresponding integrated circuit 104. The target response generator 506 may consider one or more factors regarding the integrated circuit 104 being evaluated, such as type of the integrated circuit 104, architecture of the integrated circuit 104, input signal characteristics (e.g., voltage, current, frequency), or mode of the receiver 301. The target response generator 506 may generate the target response using one or more mathematical or statistical functions. For instance, the target response 510 may correspond to a numerical distribution (e.g., a histogram), a statistical distribution, or a frequency domain transform. In some embodiments, the target response generator 506 may obtain the target response 510 from memory 512 storing a plurality of target responses.

The input data processor 508 generates a measured response 514 of the integrated circuit 104 under evaluation using the data samples 504 received. The input data processor 508 may generate the measured response 514 using the same mathematical or statistical functions as the target response generator 506. In FIG. 5 shown, the response 514 and the target response 510 shown are histograms; however, other representations of data may be implemented without departing from the scope of the present disclosure.

The nonlinearity correction module 500 also includes a response comparator 516 that performs a comparison between the target response 510 and the measured response 514 and generates a result 518 based on the comparison. Performing the comparison may include determining differences between the target response 510 and the measured response 514, such as by subtracting the target response 510 from the measured response 514 to generate the result 518.

The nonlinearity correction module 500 further includes a diagnosis module 520 that receives the result 518 and determines whether there is a deficiency related to nonlinearity in the integrated circuit 104. As a result of determining that there is a deficiency in the integrated circuit under evaluation, the diagnosis module 520 diagnoses one or more causes or contributing factors of the deficiency. For instance, with respect to the SAR ADC 300, the diagnosis module 520 may determine that an asynchronous SAR timing error or a most significant bit Capacitance-to-Digital Converter error.

The diagnosis module 520 may use, as input parameters, classification information of the integrated circuit 104, or operating mode or characteristics of the integrated circuit 104. Non-limiting examples of such operating mode or characteristics include pulse amplitude modulation, Non-Return to Zero mode, symbol rate, bit error rate, gain, offset, and frequency. The diagnosis module 520 generates deficiency information 522 regarding the nonlinearity deficiency or deficiencies detected in the integrated circuit 104. The deficiency information 522 may include numerical information regarding characteristics of the deficiency, such as magnitude, frequency, phase, peak, standard deviation, or mean, by way of non-limiting example.

The nonlinearity correction module 500 also includes a correction module 524 that generates a nonlinearity correction 526 based on the deficiency information 522. The nonlinearity correction 526 may include a set of correction coefficients that modifies operation of the integrated circuit 104 under evaluation to mitigate the nonlinearity deficiency diagnosed. As a non-limiting example, the nonlinearity correction 526 may be implemented by the DSP 312 to modify various operational aspects of the SAR ADC 300, such as the pattern generator 314, control of the multiplexor 311, or processing of a digital output signal from the multiplexor 311. The nonlinearity correction 526 is transmitted, via the communication interface 402 to the corresponding calibration circuit 106.

Figure 6:
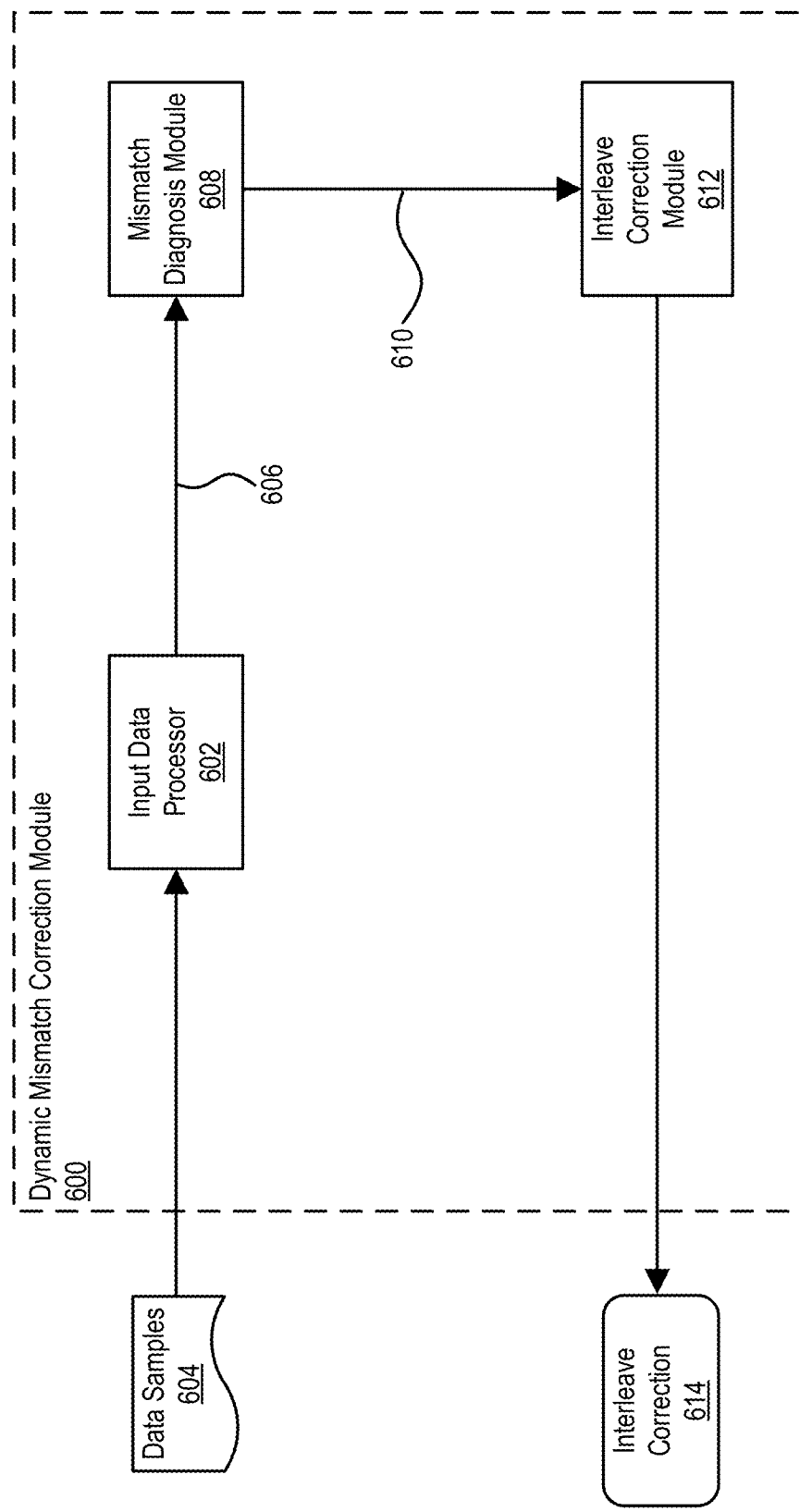
FIG. 6 illustrates a mismatch correction module of the remote calibration system of FIG. 4 according to one or more embodiments.

FIG. 6 illustrates a dynamic mismatch correction module 600 according to one or more embodiments. The mismatch correction module 600 is, in some embodiments, one of the correction modules 406 discussed with respect to FIG. 4 and elsewhere herein. The mismatch correction module 600 is configured to diagnose and correct mismatches between components in some integrated circuits, such as ADCs. For instance, with respect to the SAR ADC 300, the mismatch correction module 600 may correct mismatches between the SUB-ADCs 310. The mismatch correction module 600 is, in some embodiments, implemented as hardware, software, or a combination thereof.

The mismatch correction module 600 includes an input data processor 602 that receives a set of data samples 604, which may be obtained from outputs of one or more components of the integrated circuit 104 under evaluation. For instance, the data samples 604 may comprise samples of voltage levels of each of the SUB-ADCs 310. The input data processor 602 may obtain, over time, a collection 606 of the data samples 604 that is sufficient to perform mathematical or statistical operations to a sufficient degree of confidence.

The mismatch correction module 600 also includes a mismatch diagnosis module 608 that receives the collection of data samples 606 and determines whether there is a deficiency related to a mismatch between components of the integrated circuit 104. The mismatch diagnosis module 608 may perform various mathematical and/or statistical operations on the data sample collection 606. For instance, the mismatch diagnosis module 608 may calculate a mean or a standard deviation of the collection 606. In some embodiments, the mismatch diagnosis module 608 may perform operations to transform the collection 606 into a frequency domain—for instance, performing a Fast Fourier Transform (FFT) on the data sample collection 606. In some embodiments, the mismatch diagnosis module 608 detects mismatches in signal phases via autocorrelation, such as by calculating correlation between consecutive ADC samples and match the samples.

The mismatch-related deficiency for which the mismatch diagnosis module 608 is evaluating may include mismatches in phase, gain, offset, etc., between components of the integrated circuit 104 under evaluation. As a particular non-limiting example with respect to FIG. 3, a mismatch-related deficiency may include a mismatch in phase between two or more of the SUB-ADCs 310, for which precise phase timing between SUB-ADCs is important to efficient operation of the SAR ADC 300. For instance, in some ADCs, precision timing between two or more signal phases, which may include two-phase operation, 4-phase (quadrature) operation, or 8-phase operation, by way of non-limiting example.

As a result of a determination that a mismatch-related deficiency is present in the integrated circuit 104 under evaluation, the mismatch diagnosis module 608 generates deficiency information 610 regarding the deficiency detected. The deficiency information 610 may include numerical information regarding characteristics of a mismatch, such as magnitude of the mismatch, peak mismatch value, standard deviation, or mean, by way of non-limiting example. The deficiency information 610 may further include information identifying the components involved. As an example with respect to FIG. 3, the deficiency information 610 may include information identifying the SUB-ADC 310-2 as being out of quadrature phase with one or more of the remaining SUB-ADCs 310.

The mismatch correction module 600 includes an interleave correction module 612 that receives the deficiency information 610 and generates an interleave correction 614 based on the deficiency information 610. The interleave correction 614 may include a set of coefficients that adjust operational characteristics of one subcomponent of an integrated circuit 104 under evaluation relative to another subcomponent of the integrated circuit 104. In some implementations, the data processor 313 may implement the interleave correction 614 by sending signals to the sampler 302 and/or the sub-ADCs 310 to adjust timing, such as by implementing delays in timing between sub-ADCs 310. In some instances, the interleave correction 614 may adjust a switching timing of the sampler 302 of the SAR ADC 300 to adapt a phase of the SUB-ADC 310-1 to be in quadrature phase with the remaining SUB-ADCs. The interleave correction 614 may include information that corrects a mismatch in waveform between components of the integrated circuit 104 being evaluated. For instance, the interleave correction 614 may include coefficients that adjust timing of one or more switching devices (e.g., transistors) of the SAR ADC 300 such that quadrature phase of output of the SUB-ADCs 310 is improved.

Figure 7:
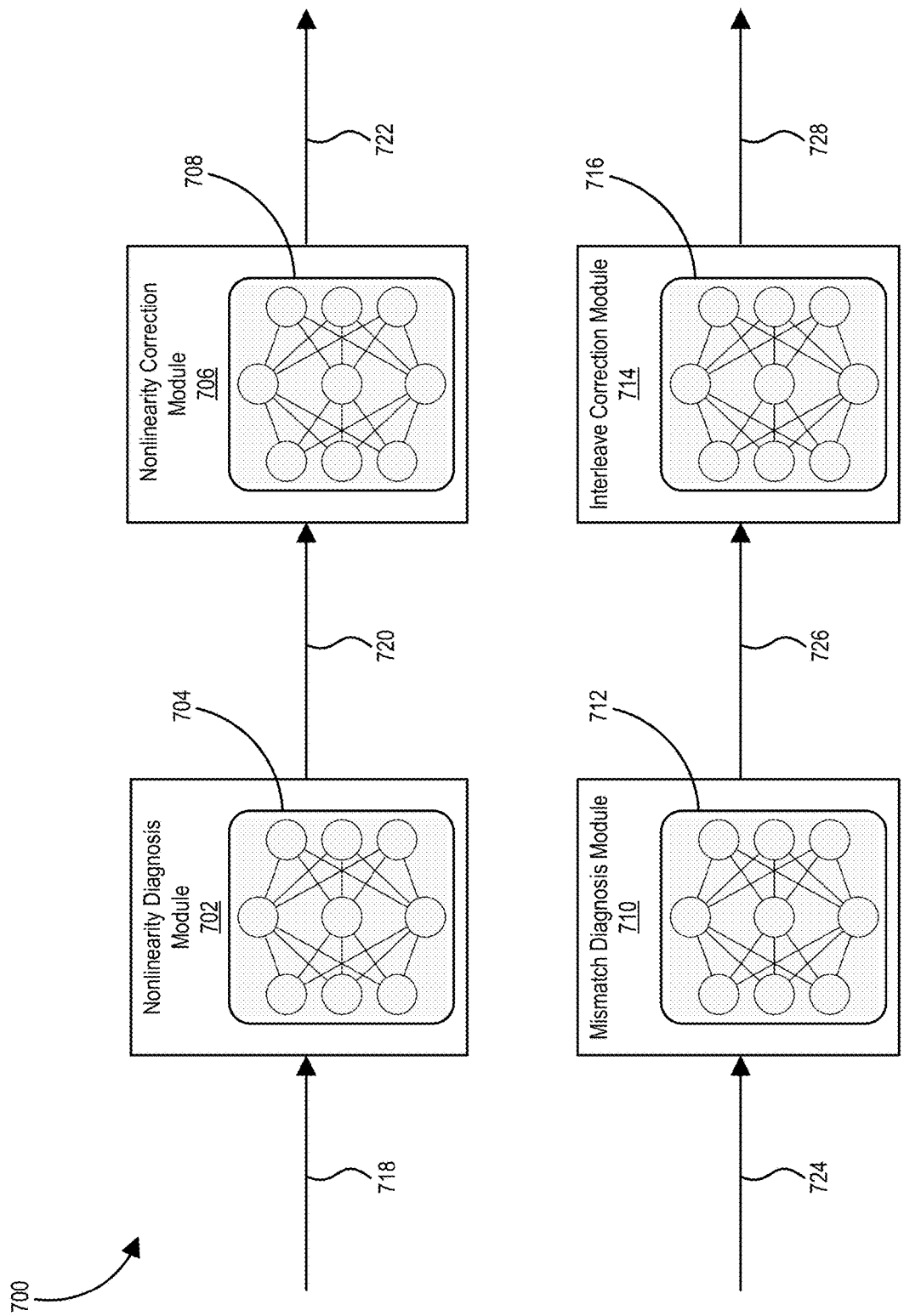
FIG. 7 illustrates a set of neural network models implemented in the remote calibration system of FIG. 4 according to one or more embodiments.

In some embodiments, the remote calibration system 112 includes one or more neural network models that are trained to remotely diagnose and/or correct deficiencies in operation of an integrated circuit 104. FIG. 7 illustrates an environment 700 in which one or more trained neural networks operate to diagnose and/or correct deficiencies in an integrated circuit under evaluation. The environment 700 includes a nonlinearity diagnosis module 702 and a nonlinearity correction module 706 respectively corresponding to the nonlinearity diagnosis module 520 and the nonlinearity correction module 524 described with respect to FIG. 5. The environment 700 also includes a mismatch diagnosis module 710 and an interleave correction module 714 respectively corresponding to the mismatch diagnosis module 608 and the interleave correction module 612 described with respect to FIG. 6.

The nonlinearity diagnosis module 702 includes a first neural network model 704 and the nonlinearity correction module 706 includes a second neural network model 708. The neural network model 704 is trained to diagnose a nonlinearity deficiency in an input 718 to the nonlinearity diagnosis module 702. In some embodiments, the neural network model 704 is trained to use the measured response 514 from a calibration circuit 106 as the input 718. In some embodiments, the neural network model 704 is trained to use the result 518 from the response comparator 516 as the input 718. As a result of determining that there is a nonlinearity deficiency in the input 718, the neural network model 704 generates deficiency information 720 corresponding to the deficiency information 522 described with respect to FIG. 5. The neural network model 708 of the nonlinearity correction module 706 receives and uses the deficiency information 720 as input and generates a nonlinearity correction 722 as a result, as also described with respect to FIG. 5 and elsewhere herein. In some embodiments, the neural network models 704 and 708 may be a single neural network model that is trained to generate the nonlinearity correction 722 based on the input 718. In some embodiments, the remote calibration system 112 may use a single neural network of the neural networks 704 and 708.

The mismatch diagnosis module 710 includes a third neural network model 712 and the interleave correction module 714 includes a fourth neural network model 716. The neural network model 712 is trained to diagnose a mismatch deficiency in an integrated circuit under evaluation, as described with respect to FIG. 6 and elsewhere herein, based on an input 724. In some embodiments, the neural network model 712 is trained to use the data samples 604 described with respect to FIG. 6 as the input 724. In some embodiments, the neural network model 712 is trained to use the collection of data samples 606 as the input 724. As a result of a determination that the input 724 includes a mismatch deficiency, the neural network model 712 generates deficiency information 726 corresponding to the deficiency information 610 described with respect to FIG. 6. The neural network model 716 of the interleave correction module 714 receives and uses the deficiency information 726 as input and generates an interleave correction 728 as a result, as described with respect to FIG. 6 and elsewhere herein. In some embodiments, the neural network models 712 and 716 may be a single neural network model that is trained to generate the interleave correction 728 based on the input 724. In some embodiments, the remote calibration system 112 may use a single neural network of the neural networks 712 and 716.

Figure 8:
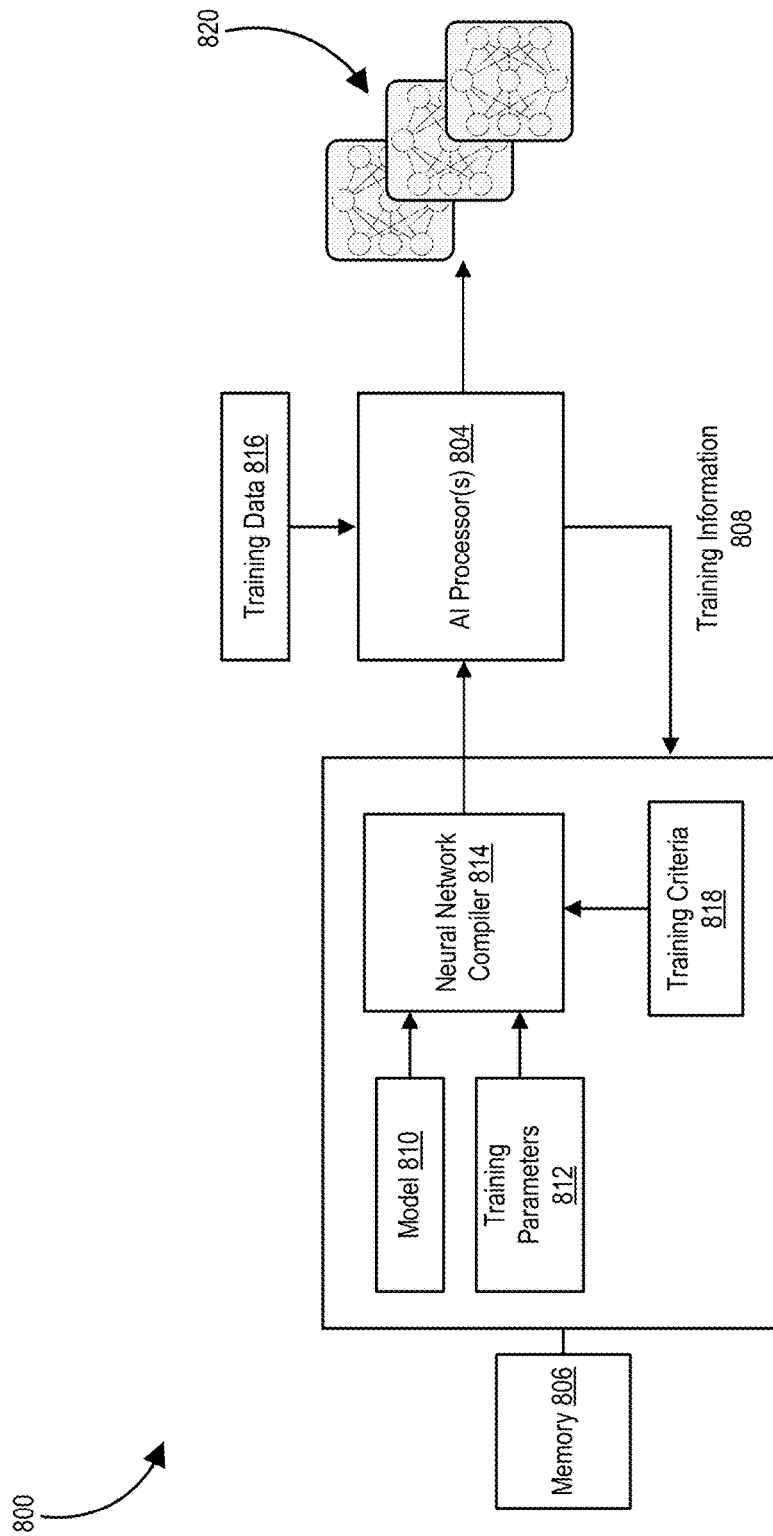
FIG. 8 illustrates a neural network training system for training one or more of the set of neural network models of FIG. 7.

FIG. 8 illustrates a system 800 for training an artificial neural network according to one or more embodiments. In this example, one or more control processor(s) 802 may be in communication with one or more AI processor(s) 804. Control processor(s) 802 may include traditional CPUs, FPGAs, systems on a chip (SoC), application specific integrated circuits (ASICs), or embedded ARM controllers, for example, or other processors that can execute software and communicate with AI processor(s) 804 based on instructions in the software. AI processor(s) 804 may include graphics processors (GPUs), AI accelerators, or other digital processors optimized for AI operations (e.g., matrix multiplications versus Von Neuman Architecture processors such as the x86 processor). Example AI processor(s) may include GPUs (e.g., NVidia Volta® with 800 cores and 64 MultiAccumulators) or a Tensor Processor Unit (TPU) (e.g., 4 cores with 16 k operations in parallel), for example.

In this example, a control processor 802 may be coupled to memory 806 (e.g., one or more non-transitory computer readable storage media) having stored thereon program code executable by control processor 802. The control processor 802 receives (e.g., loads) a neural network model 810 (hereinafter, "model") and a plurality of training parameters 812 for training the model 810. The model 810 may comprise, for example, a graph defining multiple layers of a neural network with nodes in the layers connected to nodes in other layers and with connections between nodes being associated with trainable weights. The training parameters 812 may comprise one or more values which may be adjusted to affect configuration and/or execution of the model 810.

The control processor 802 may also execute a neural network compiler 814. The neural network compiler 814 may comprise a program that, when executed, may receive a model 810 and training parameters 812 and implement and execute the model 810 in hardware. For instance, the neural network compiler 814 may receive and configure the model 810 based on one or more of the training parameters 812 to execute a training process executed on AI processor(s) 804. The neural network compiler 814 may cause the one or more AI processors 804 to implement calculations of input activations, weights, biases, backpropagation, etc., to perform the training process.

The AI processor(s) 804 may perform numerous matrix multiplication calculations in a forward pass, compare outputs against known outputs for subsets of training data 816, and perform further matrix multiplication calculations in a backward pass to determine updates to various neural network training parameters, such as gradients, biases, and weights. This process may continue through multiple iterations as the training data 816 is processed. In some embodiments, AI processor(s) 804 may determine the weight updates according to a backpropagation algorithm that may be configured by the neural network compiler 814. Such backpropagation algorithms include stochastic gradient descent (SGD), Adaptive Moment Estimation (ADAM), and other algorithms known to those skilled in the art.

During training of the model 810, one or more values for activations, biases, weights, gradients, or other parameter may be generated or updated for one or more layers, nodes, and/or connections of the model 810. During training, the AI processor(s) 804 may generate training information 808 that is useable to determine a status or a progress of training the model 810. The AI processor(s) 804 may provide the training information 808 to the control processor(s) 802. The training information 808 may include outputs generated by the neural network model 810 being trained using the training data 816. The AI processor(s) 804 and/or the control processor 802 may use the training information 808 to determine whether to adjust various parameters or attributes of the neural network training process. The control processor 802 may obtain or possess training criteria 818 for determining whether to adjust the training attributes or parameters. The training criteria 818 may include a defined training loss threshold or range for convergence. As a result of a neural network model converging to within the defined training loss threshold or range, the AI processor(s) 804 may determine that the neural network model 810 is sufficiently trained and discontinue the training process for the neural network model 810.

The system 800 is configured to generate a set of trained neural network models 820 that include one or more of the neural network models 704, 708, 712, and 716. To train the neural network model 704 to diagnose nonlinearity deficiencies, the control processor 802 may provide measured responses from integrated circuits having known nonlinearity deficiencies as the training data 816 in some embodiments. The control processor 802 may adjust training and/or gauge training loss of the model 810 being trained based on outputs of the model 810 relative to known deficiency information for the integrated circuits. In some embodiments, the control processor 802 may provide, as the training data 816, known comparison results from a response comparator that correspond to integrated circuits having known nonlinearity deficiencies and may adjust training and/or gauge training loss of the model 810 being trained based on outputs of the model 810 relative to known deficiency information for the integrated circuits.

To train the neural network model 708 to generate nonlinearity corrections 722, the control processor may provide information regarding known nonlinearity deficiencies as the training data 816 in some embodiments. The control processor 802 may adjust training and/or gauge training loss of the model 810 being trained based on outputs of the model 810 relative to known nonlinearity corrections for the known nonlinearity deficiencies. In some embodiments, to train a single neural network that generates nonlinearity corrections 722 using measured responses from integrated circuits 104 as input, the control processor 802 may provide measured responses from integrated circuits having known nonlinearity deficiencies as the training data 816. The control processor 802 may adjust training and/or gauge training loss of the model 810 being trained based on outputs of the model 810 relative to known nonlinearity corrections for the known nonlinearity deficiencies.

To train the neural network model 712 to diagnose mismatch deficiencies, the control processor 802 may provide data samples or measured responses from integrated circuits having known mismatch deficiencies as the training data 816 in some embodiments. The control processor 802 may adjust training and/or gauge training loss of the model 810 being trained based on the outputs of the model 810 relative to known mismatch deficiency information for the integrated circuits.

To train the neural network model 716 to generate interleave corrections 728, the control processor may provide information regarding known mismatch deficiencies as the training data 816 in some embodiments. The control processor 802 may adjust training and/or gauge training loss of the model 810 being trained based on outputs of the model 810 relative to known interleave corrections for the known mismatch deficiencies. In some embodiments, to train a single neural network that generates mismatch corrections 728 using data sets from integrated circuits 104 as the input 724, the control processor 802 may provide data sets from integrated circuits having known mismatch deficiencies as the training data 816. The control processor 802 may adjust training and/or gauge training loss of the model 810 being trained based on outputs of the model 810 relative to known interleave corrections for the known mismatch deficiencies.

Figure 9:
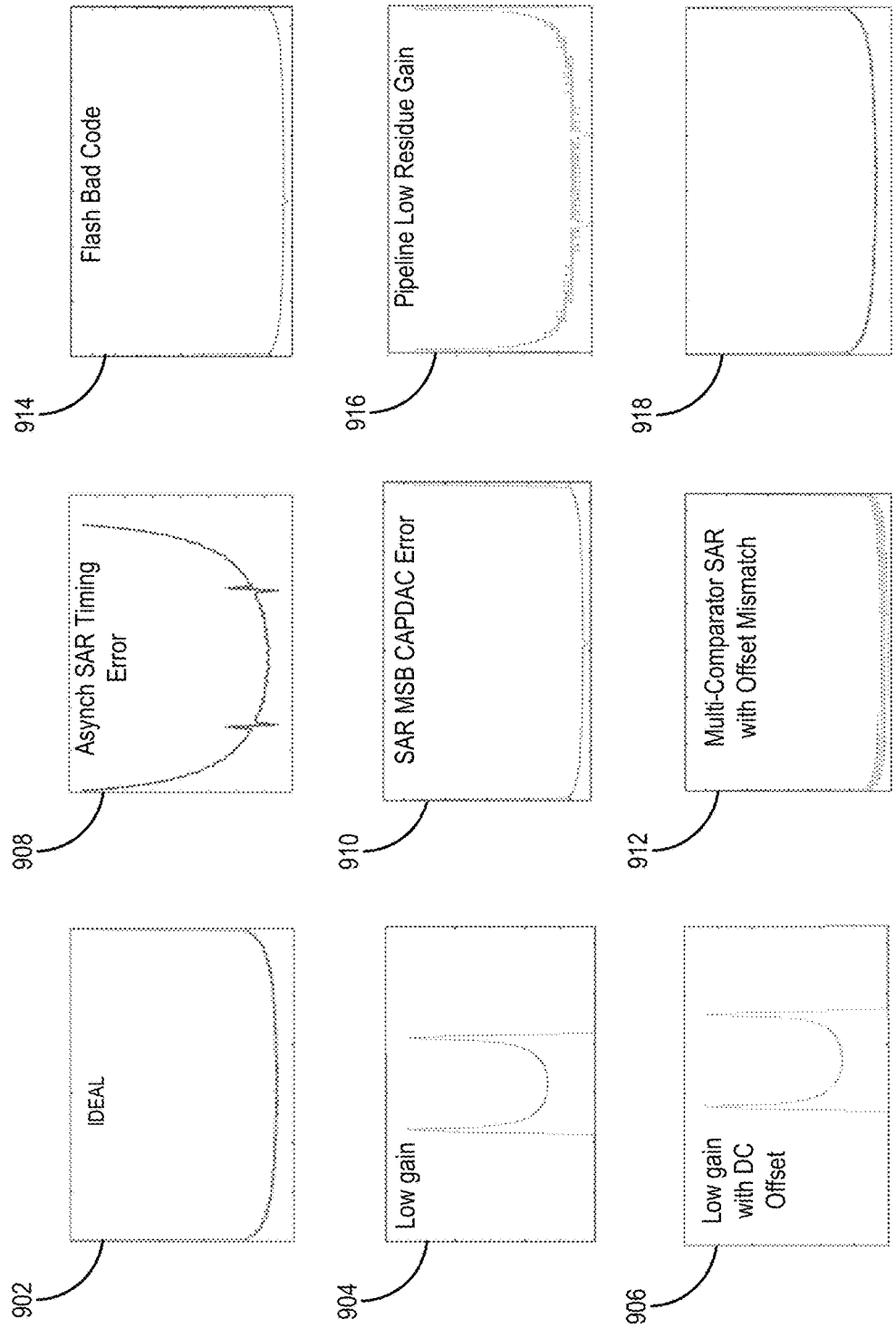
FIG. 9 illustrates a plurality of graphical representations of data sets obtained during operation of one or more integrated circuits.

FIG. 9 shows graphical representations corresponding to data generated by integrated circuits according to one or more embodiments. The data may be used by the system 800 in some embodiments to train one or more neural network models. A first representation 902 shows a histogram of output data generated by an integrated circuit, such as an ADC, without any deficiencies in operation. The data of the first representation 902 may correspond to the target response 510 used or generated by the target response generator 506. A second graphical representation 902 shows a histogram of output data generated by an integrated circuit, such as an ADC, with low gain, which may be a nonlinearity deficiency in operation. A third graphical representation 906 shows a histogram of output data generated by an integrated circuit, such as an ADC, with low gain and a DC offset, which may be another nonlinearity deficiency in operation.

A fourth graphical representation 908 shows a histogram of output data generated by an integrated circuit, such as an SAR ADC, with an asynchronous timing error, which may be a further nonlinearity deficiency in operation. A fifth graphical representation 910 shows a histogram of output data generated by an integrated circuit, such as an SAR ADC, with a most significant bit Capacitance-to-Digital Converter error, which may be another nonlinearity deficiency in operation. A sixth graphical representation 912 shows a histogram of output data generated by an integrated circuit, such as an SAR ADC, with a mismatch offset, which may be a mismatch deficiency in operation.

A seventh graphical representation 914 shows a histogram of output data generated by an integrated circuit, such as a flash ADC, with a bad flash code, which may be a nonlinearity deficiency in operation. An eighth graphical representation 916 shows a histogram of output data generated by an integrated circuit, such as a pipelined ADC, with low residue gain, which may be an additional nonlinearity deficiency in operation. A ninth graphical representation 918 shows a histogram of output data generated by an integrated circuit, such as a Sigma Delta ADC, without any deficiencies. The data of the ninth representation 916 may correspond to the target response 510 used or generated by the target response generator 506. The foregoing representations of data sets provide non-limiting examples of various deficiencies and target responses that may be associated with operation of the remote calibration system 112. It is understood that the remote calibration system 112 can be implemented to diagnose and correct a myriad of other deficiencies in operation of a variety of integrated circuits.

Figure 10:
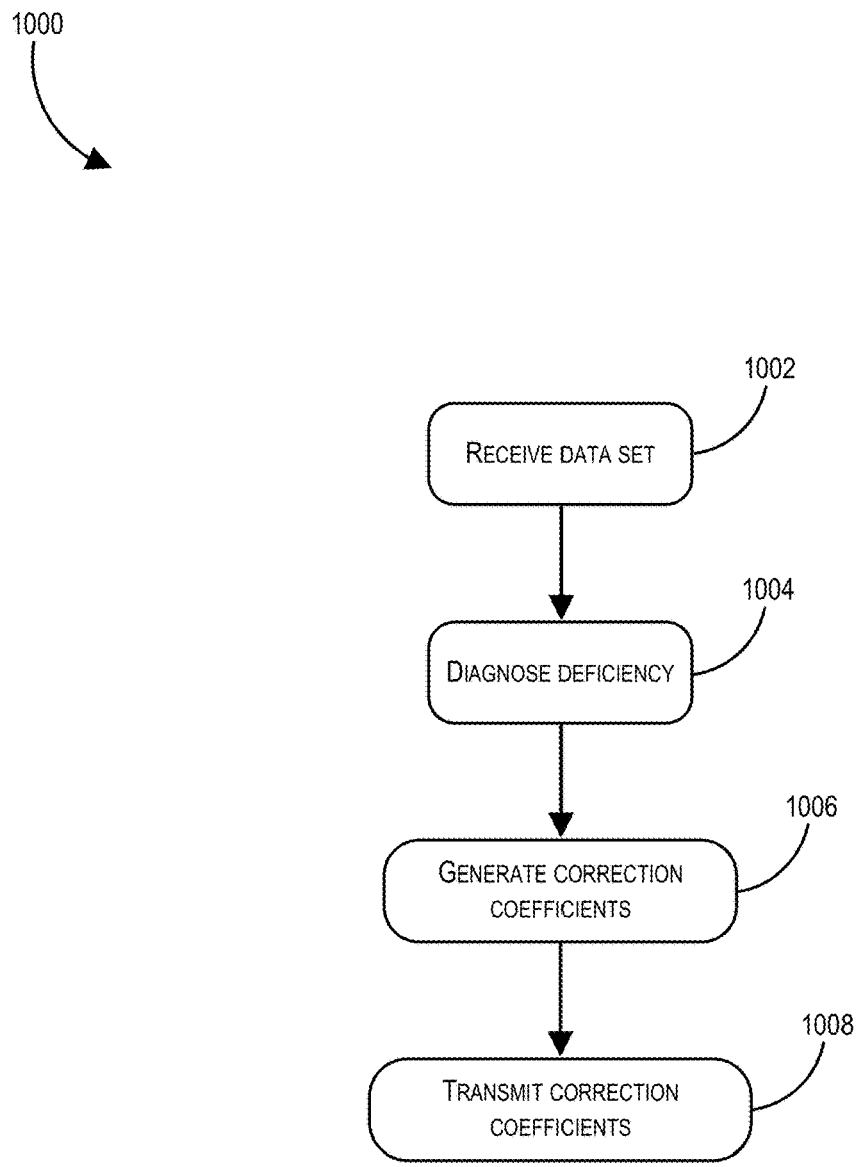
FIG. 10 illustrates a method for remotely diagnosing and correcting deficiencies in operation of an integrated circuit according to one or more embodiments.

FIG. 10 shows a method 1000 for remotely diagnosing and correcting deficiencies in operation of an integrated circuit according to one or more embodiments. The method may be performed by one or more entities described herein, such as the remote calibration system 112 and/or various sub-entities thereof. Various features of the method 1000 are described in detail elsewhere herein, so further description is omitted for brevity.

The method 1000 includes receiving, at 1002 a set of data obtained over the network 110 via the communication interface 402 from an integrated circuit. In some embodiments, the integrated circuit may be an ADC. The method 1000 also includes diagnosing, at 1004, a deficiency in operation of the integrated circuit. The deficiency may be diagnosed, in 1004, based on a comparison between a measured response and a target response in some embodiments. In some embodiments, the deficiency may be diagnosed by a trained neural network.

At 1006, the method 1000 includes generating a set of correction coefficients based on the deficiency diagnosed in 1008. The set of correction coefficients may modify operation of one or more subcomponents of the integrated circuit, such as the DSP 312 or the SUB-ADCs 310 discussed with reference to FIG. 3. More particularly, the set of correction coefficients mitigate or eliminate the deficiency diagnosed in 1008. The method 1000 further includes, at 1008, transmitting the set of correction coefficients to the integrated circuit over a network. A calibration circuit of the integrated circuit may implement the set of coefficients, thereby improving operation of the integrated circuit.

Figure 11A:
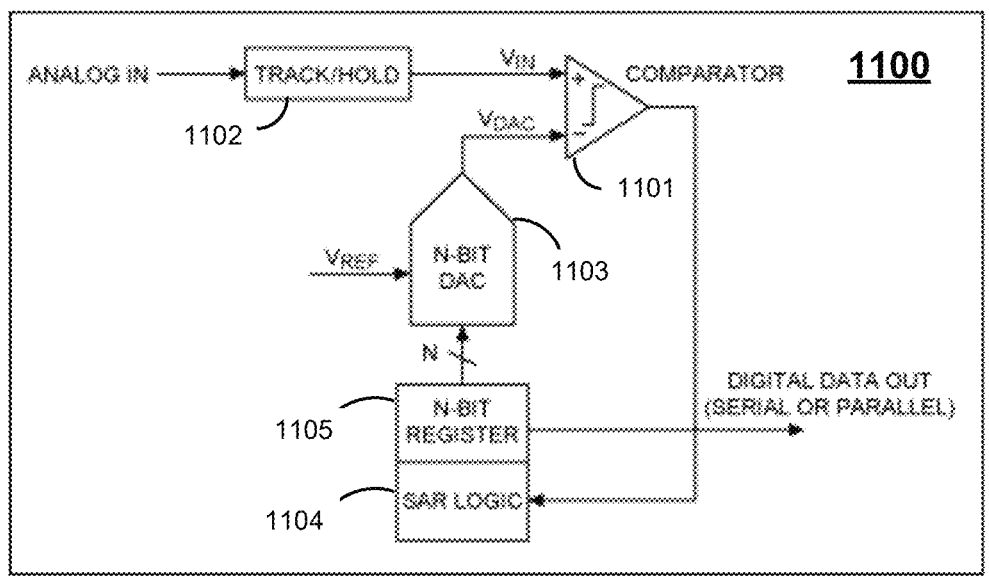
FIG. 11A illustrates an example successive approximation register analog-to-digital converter.

FIG. 11A illustrates an example successive approximation register (SAR) analog-to-digital converter (ADC) 1100. SAR ADC 1100 includes a track and hold circuit 1102 (aka sample and hold) that receives an analog input signal (ANALOG IN) and outputs a sampled analog voltage (Vin) that is provided at one input of a comparator 1101. The second input of comparator 1101 receives a reference voltage, Vdac, from a digital-to-analog converter (DAC) 1103. The output of comparator 1101 is coupled to an SAR logic 1104, which changes the digital value (or digital code) in an N-bit register 1105 (e.g., up or down depending on the comparison of Vin and Vdac). The register is coupled to the input of an N-bit DAC 1103, which also receives a reference voltage, Vref, to produce Vdac.

Figure 11B:
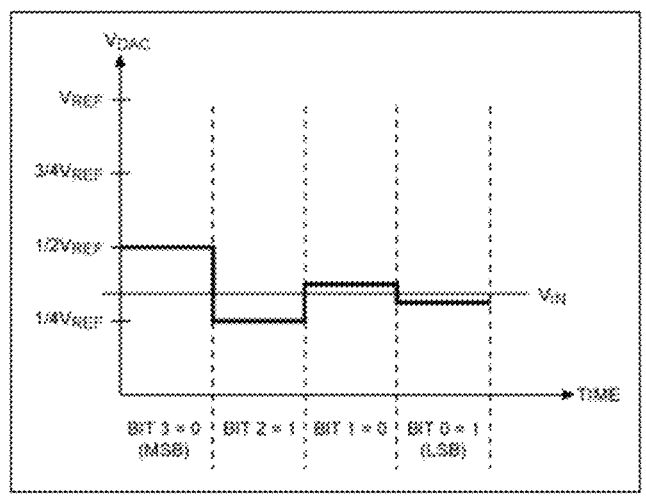
FIG. 11B illustrates resolution of bits of the example successive approximation register analog-to-digital converter in FIG. 11A.

FIG. 11B illustrates the resolution of bits of a successive approximation register (SAR) analog-to-digital converter 1100. The operation of the circuit in FIG. 11A is illustrated in FIG. 11B. On a first conversion cycle, Vdac may be set to ½ of Vref and compared to Vin. If Vin is greater than Vdac, the most significant bit (MSB) is set to 1, and if Vin is less than Vdac, the MSB is set to 0. On the next conversion cycle, Vdac is reduced to ¼ Vref (e.g., half the distance between the prior voltage and the next voltage above or below the prior voltage based on the comparator output) and compared to Vin. If Vin is greater than ¼ Vref, the next significant bit is set to 1, and if Vin is less than ¼ Vref, the next bit is set to 0. The process proceeds across multiple additional bits (e.g., 4 bits in this example), where Vdac is successively set one-half a previous reference voltage step above or below the value of the previous step, and thus converging to Vin. More generally, an SAR ADC is an ADC that translates an analog input value (voltage or current) into a digital value by comparing the input value to references (voltage or current) that converge on the input value. It is to be understood that SAR ADC 1100 is just one example of an SAR ADC.

Figure 12A:
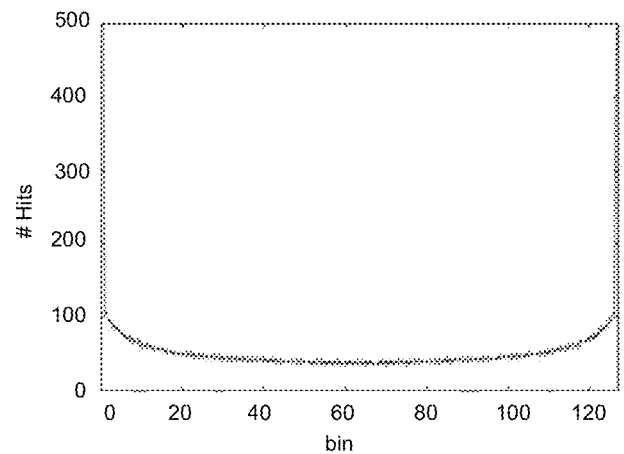
FIG. 12A illustrates an ideal sinewave histogram for an example successive approximation register analog-to-digital converter.

FIG. 12A illustrates an ideal histogram for a successive approximation register analog-to-digital converter. The histogram in FIG. 12A may comprise counts of the digital output codes across a range of analog input signal values for an input signal (here, a sine wave). Ideally, a sine wave input produces a smooth curve histogram as shown, where different digital output codes are stored in "bins" and each bin has a count indicating the number of times a particular digital output code was produced. Features and advantages of the present disclosure include calibrating analog-to-digital converters, such as SAR ADCs, based on such counts.

Figure 12B:
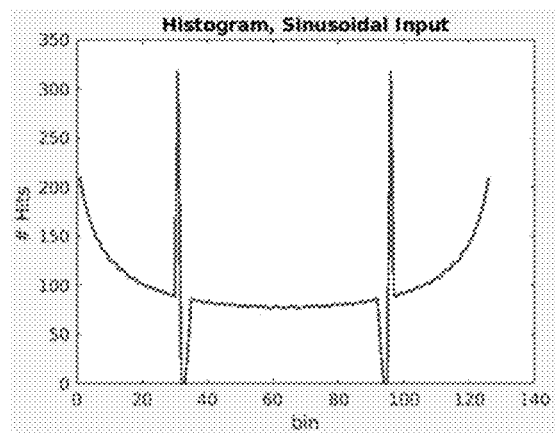
FIG. 12B illustrates errors in a histogram of a successive approximation register analog-to-digital converter.

FIG. 12B illustrates errors in a histogram of a successive approximation register analog-to-digital converter. FIG. 12B shows non-ideal counts for an SAR ADC with a sine wave input. FIG. 12B illustrates that errors in the conversion process result in distortion of the counts. In this example, the erroneous counts are in bins 31/32 and 95/96. It is to be understood that FIGS. 12A-B are for illustrative purposes only. More generally, embodiments of the present disclosure may detect errors in an ADC and correct such errors based on counts resulting from patterns applied to the inputs, for example.

Features and advantages of the present disclosure include applying a pattern of input signal values across a range to the input of an ADC and detecting errors in counts of digital output codes across the range. The errors in counts may be used to adjust configuration parameters of the ADC. For example, errors in counts may be used to adjust one or more delays of a clock signal to a comparator in the ADC to reduce errors in the counts. In some embodiments, calibration algorithms may be executed by remote servers (e.g., a cloud server) to analyze histograms and configure parameters (e.g., delays) of an ADC to improve performance.

Figure 13A:
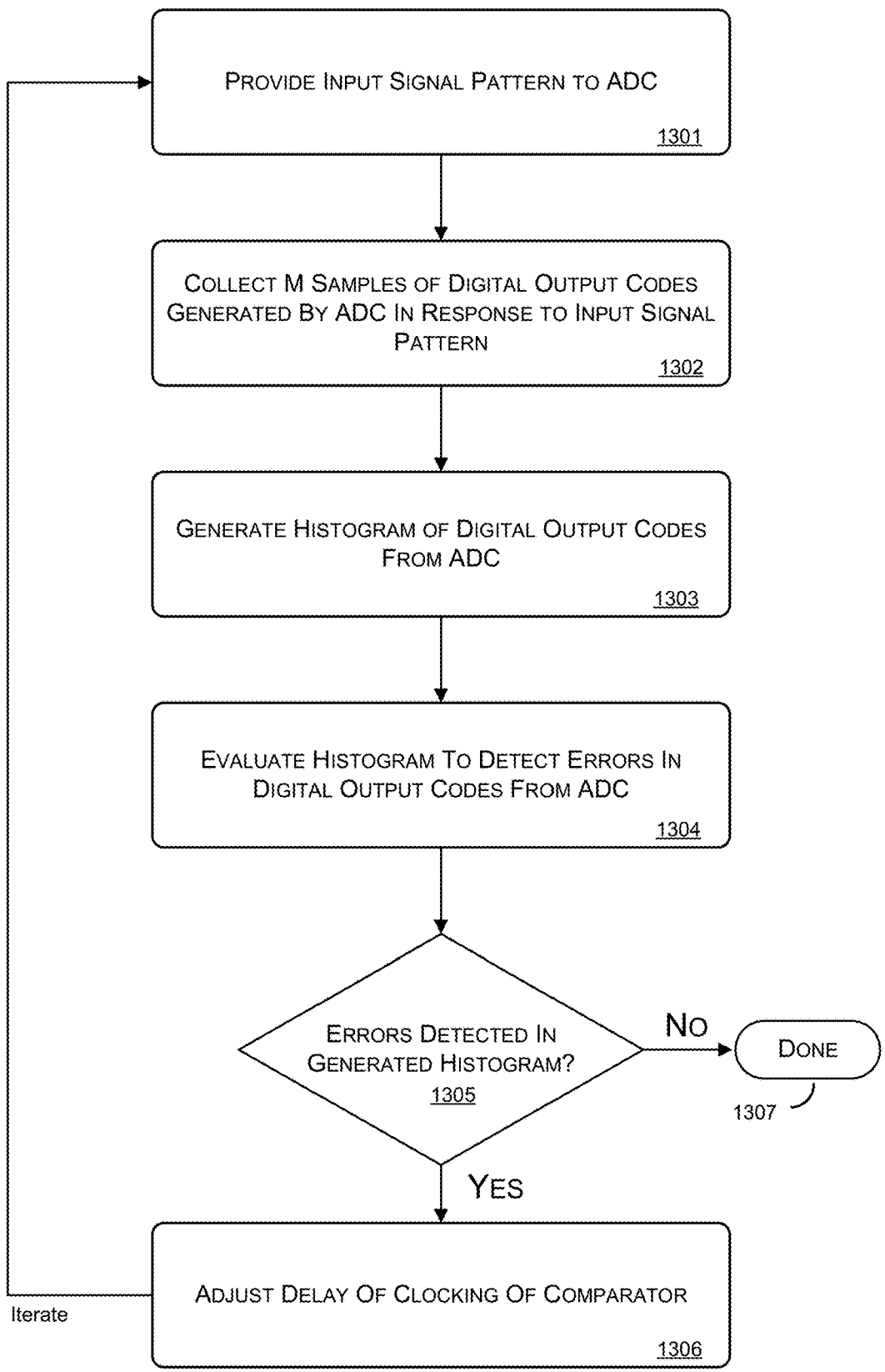
FIG. 13A illustrates calibrating a successive approximation register analog-to-digital converter according to one or more embodiments.

FIG. 13A illustrates calibrating a successive approximation register analog-to-digital converter according to an embodiment. The example method illustrated in FIG. 13A iteratively adjusts the delay to a comparator to remove errors. For example, at 1301, an analog input signal pattern is provided to an input of a successive approximation register (SAR) analog-to-digital converter (ADC). The pattern may apply a range of analog input values to the input of the SAR ADC. In various embodiments, the analog input signal pattern causes the analog-to-digital converter to provide input voltages corresponding to all digital output codes across the range of analog input signal values. The range of the pattern may further cover the full range of the SAR ADC (e.g., the full range of input values for which digital codes may be generated). In response to the pattern, digital output codes are generated. Generating digital output codes in response to a range of input values may cause the calibration circuit to clock one or more comparator(s) in the SAR ADC, as described above. At 1302, M (an integer) samples of output codes generated by the SAR ADC in response to the analog input signal pattern are collected. At 1303, a histogram of digital output codes is generated. At 1304, the histogram is evaluated (e.g., by a calibration algorithm) to detect errors in the digital output codes. At 1305, if errors are detected, the clock (e.g., a trigger) of the comparator is adjusted (at 1306) and the process repeats. The process may iterate until the error is sufficiently small (e.g., below a desired threshold), at which point the process is done at 1307.

Figure 13B:
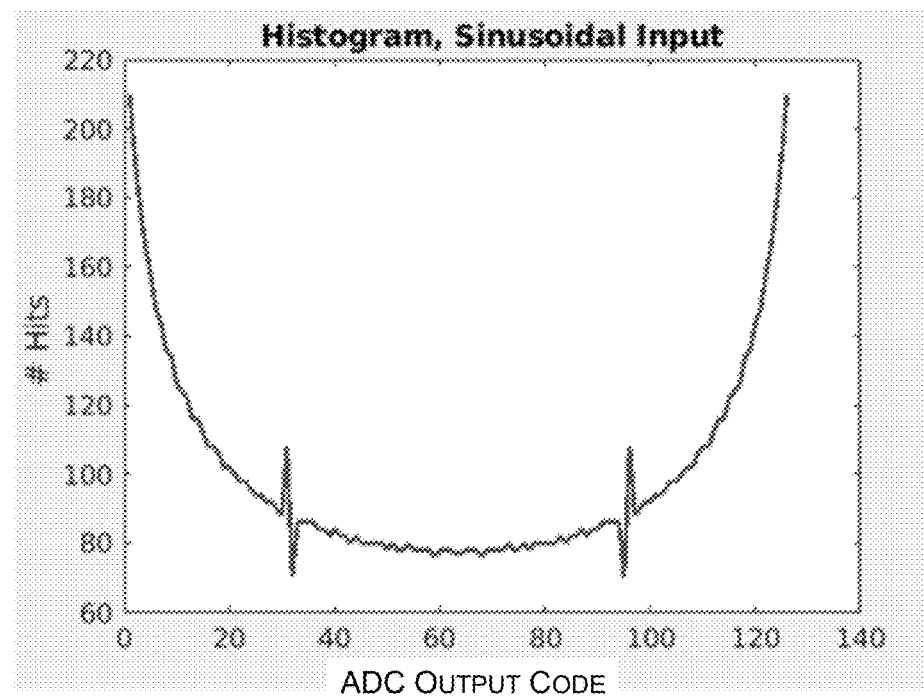
FIG. 13B illustrates error in a histogram of a calibrated successive approximation register analog-to-digital converter according to one or more embodiments.
Figure 13C:
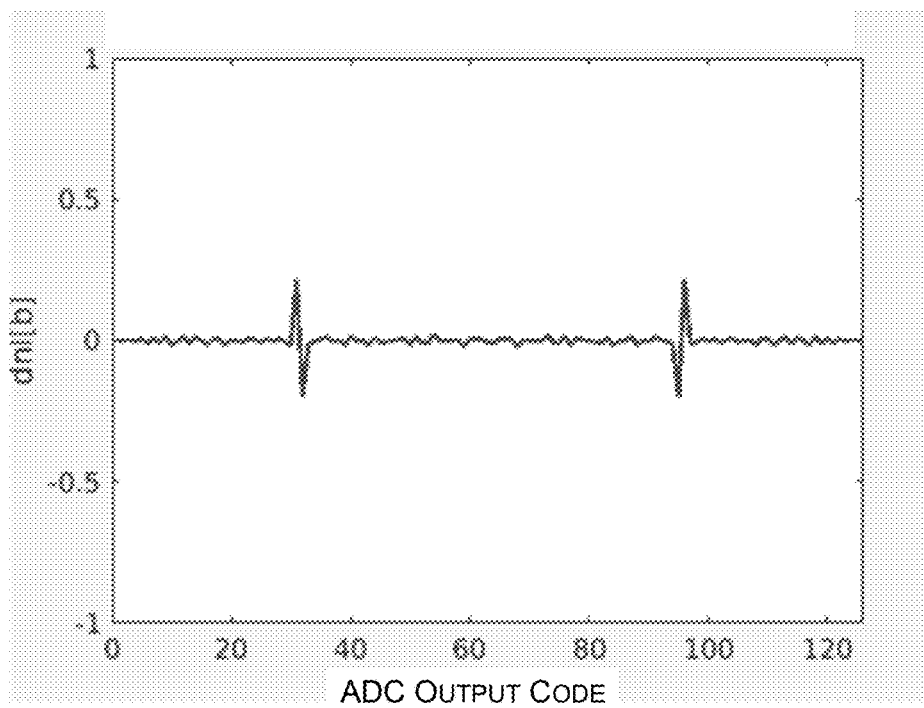
FIG. 13C illustrates differential non-linearity (DNL) in a histogram of a calibrated successive approximation register analog-to-digital converter according to one or more embodiments.

FIG. 13B illustrates error in a histogram of a calibrated successive approximation register analog-to-digital converter according to an embodiment. The example shown in FIG. 13B is for a 7-bit SAR ADC and has errors in codes 31/32 and 95/96. However, using the techniques described above the error has been reduced below a threshold, which may be set by design based on tradeoffs between maintaining high speed and accuracy, for example. FIG. 13C illustrates differential non-linearity (DNL) in a histogram of a calibrated successive approximation register analog-to-digital converter according to an embodiment. As illustrated in FIG. 13C, DNL is also reduced as the errors in the histogram are reduced using the techniques described herein.

Figure 14A:
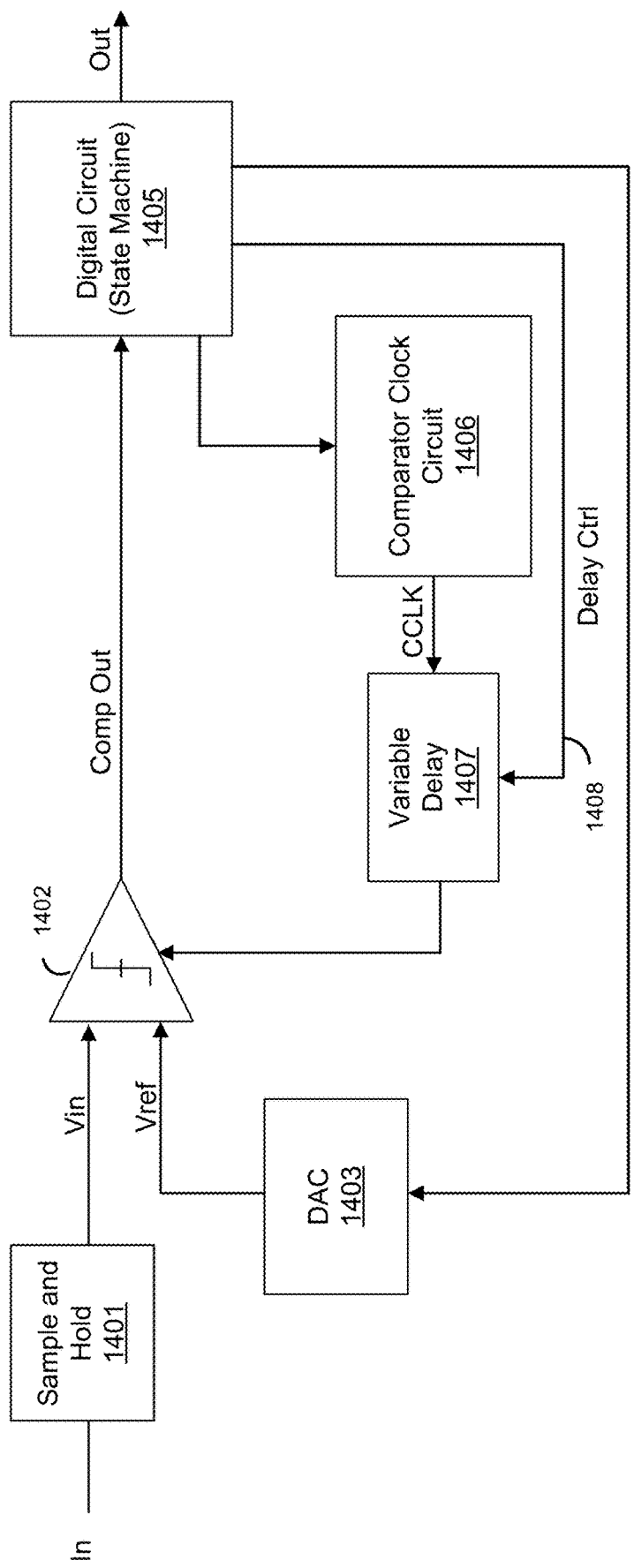
FIG. 14A illustrates an example successive approximation register analog-to-digital converter according to one or more embodiments.

FIG. 14A illustrates an example successive approximation register analog-to-digital converter according to an embodiment. In this example, an input voltage is received at the input, In, of a sample and hold (S/H) circuit 1401. The input voltage may be a pattern that includes voltages across the full range of the SAR ADC so that all codes the SAR ADC is able to produce are (or should be) produced. The output of S/H 1401 provides an input voltage, Vin, coupled to one input of comparator 1402. Vin may be held for a certain time period (e.g., a sample and hold time) so that the comparator can compare it to a reference voltage, Vref, coupled to the other input of comparator 1402. Vref is generated by a digital to analog converter (DAC) 1403. The output of comparator 1402 is coupled to a digital circuit 1405, which may be a state machine, for example. Digital circuit 1405 may program the DAC output voltage, Vref, for example. Digital circuit 1405 may further control a comparator clock circuit 1406, which provides a clock signal, CCLK, to comparator 1402. CCLK may be a square wave, pulse, or edge to trigger the comparison, for example. Digital circuit 1405 may further generate a delay control signal 1418 to control variable delay 1407. Digital circuit 1405 may iteratively adjust the delay based on count errors to reduce such errors as described above. Histogram processing may be incorporated into digital circuit 1405, for example, or alternatively performed by a separate component or on a remote server according to other advantageous features of the present disclosure.

Figure 14B:
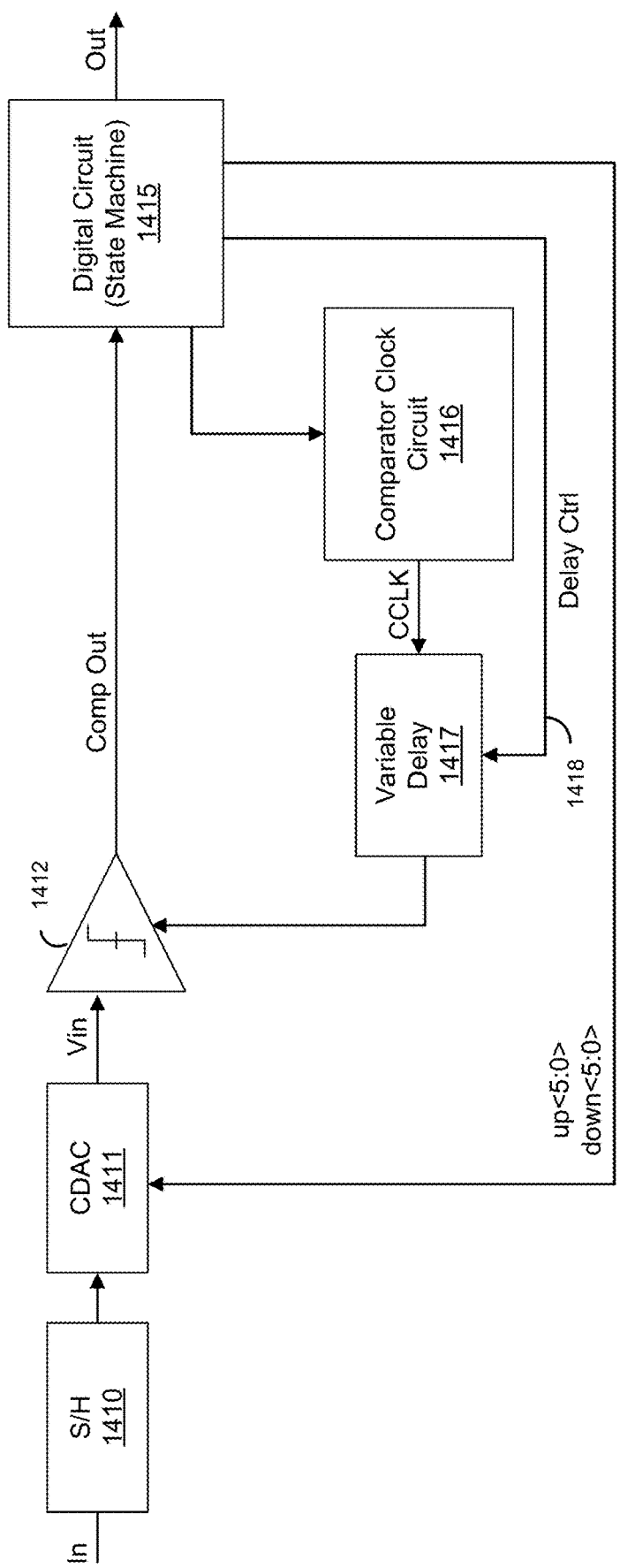
FIG. 14B illustrates another example successive approximation register analog-to-digital converter according to one or more embodiments.

FIG. 14B illustrates another example successive approximation register analog-to-digital converter according to an embodiment. In this example, an SAR ADC may include sample and hold 1410, DAC 1411, comparator 1412, digital circuit (e.g., a state machine) 1415, comparator clock circuit 1416, and variable delay circuit 1417 that perform calibration and delay adjustment as described above. In this example, DAC 1411 is a capacitive digital to analog converter (CDAC). CDACs are a type of DAC that change the output voltage by selectively coupling plates of capacitors between reference voltages, such as a power supply or ground, for example. Digital circuit 1415 may send digital "up" and "down" control signals to CDAC 1411 to set Vin, which may operate differentially such that Vin converges on differential ground over multiple conversion cycles. Similar to the above embodiments, digital circuit 1415 may generate delay control signal 1418 to adjust the comparator clock delay, CCLK, to reduce errors in a histogram.

Figure 15:
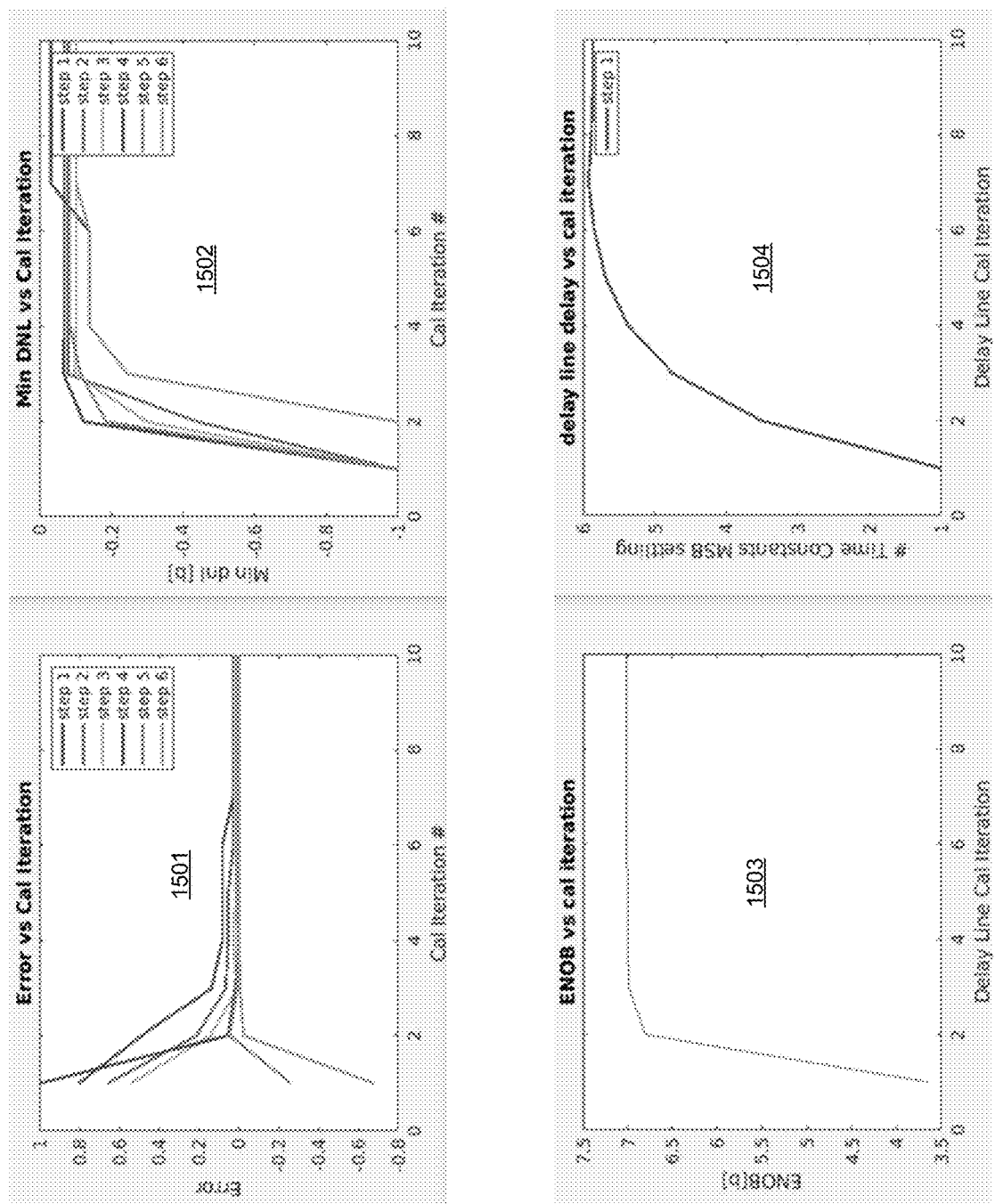
FIG. 15 illustrates plots of various metrics for multiple iterations of a successive approximation register analog-to-digital converter according to one or more embodiments.

FIG. 15 illustrates plots for multiple iterations of a successive approximation register analog-to-digital converter according to an embodiment. Plot 1501 illustrates error over multiple calibration iterations (e.g., as illustrated in FIG. 13A). In plot 1501, different steps refer to different bits. Accordingly, plot 1501 illustrates settling error for different bits (e.g., step 1=MSB, step 2=MSB-1, etc. . . . ). As illustrated in plot 1501, error for each step drops off to near zero within about 3 iterations for this example. Plot 1502 illustrates the improvement in DNL over multiple iterations, where DNL similarly is reduced over just a few iterations. Plot 1503 illustrates effective number of bits (ENOB), which increases to 7-bits in this example after 3 iterations. Plot 1504 illustrates the adjusted delay (in terms of number time constants, "tau," for the MSB) over multiple iterations. Plot 1504 illustrates that the delay may start at some nominal value (<>0) and increase. The optimum delay and threshold for error may be selected based on the values in the other plots at a particular iteration and other design factors, for example.

Figure 16:
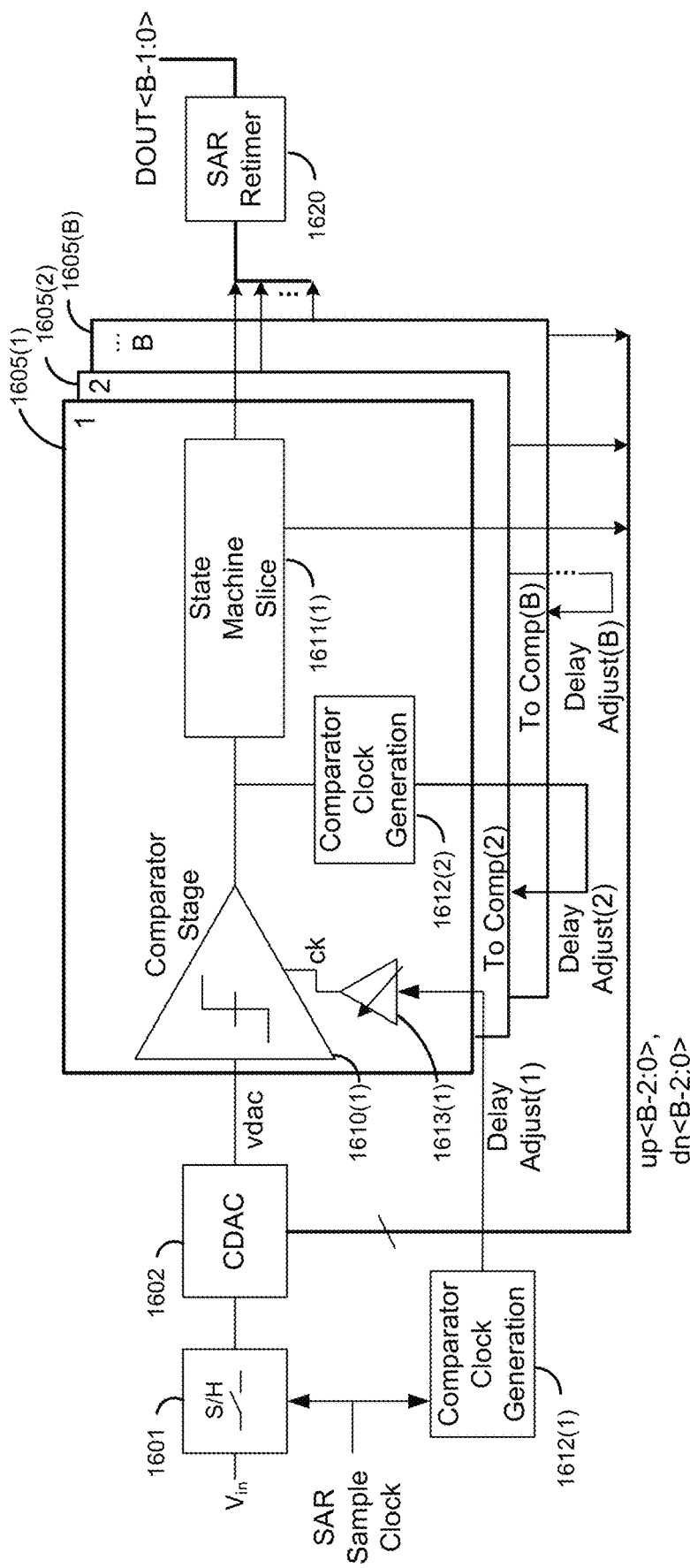
FIG. 16 illustrates another example successive approximation register analog-to-digital converter according to one or more embodiments.

FIG. 16 illustrates another example SAR ADC according to an embodiment. In this example, an SAR ADC includes a plurality of analog-to-digital converters 1605(1)-(B) configured in parallel. Each ADC includes a comparator for each bit. Accordingly, the number of comparators is equal to the number (B) of bits of the digital output code. During a conversion cycle, an input voltage, Vin, such as a pattern, is coupled through sample and hold (S/H) 1601 and CDAC 1602. The output of CDAC 1602 may be coupled to a plurality of ADC stages 1605(1)-(B) configured in parallel. Each stage includes a comparator 1610(1)-(B) and delay adjust circuit 1613(1)-(B). As each sample of Vin is resolved by the ADC, state machines 1611(1)-(B) adjust CDAC 1602 to successively resolve B-bits at the output of each comparator. The bits may be recombined in retimer circuit 1620, for example. A calibration circuit (not shown) may be configured to generate a separate delay control signal (e.g., delay adjust(1)-(B)) to adjust a separate delay circuit 1613 (1)-(B) for each of a plurality of comparator clock signals applied to the comparators from comparator clock generators 1612(1)-(B). In this example, clock generators 1612(1)-(B) are configured to successively provide clock signals to a subsequent comparator to resolve each bit. For instance, clock generator 1612(1) generates a clock for comparator 1610(1), an output of which is coupled to clock generator 1612(2) to generate a clock for comparator 1610(2) (not shown) in ADC 1605(2), and so on for each ADC stage/bit. Parallel comparator approaches as illustrated here may be advantageous in high-speed applications to improve reliability (e.g., multiple lower speed/higher reliability comparators may be used in parallel rather than one higher speed comparator), speed (e.g., comparators may reset while another resolves a bit), and accuracy (e.g., comparators may be fine-tuned separately), for example. It is to be understood that during calibration, delay circuits 1613(1)-(B) may be configured independently for each bit over multiple iterations of an input pattern to reduce or eliminate error as described above.

Example Computer System

Figure 17:
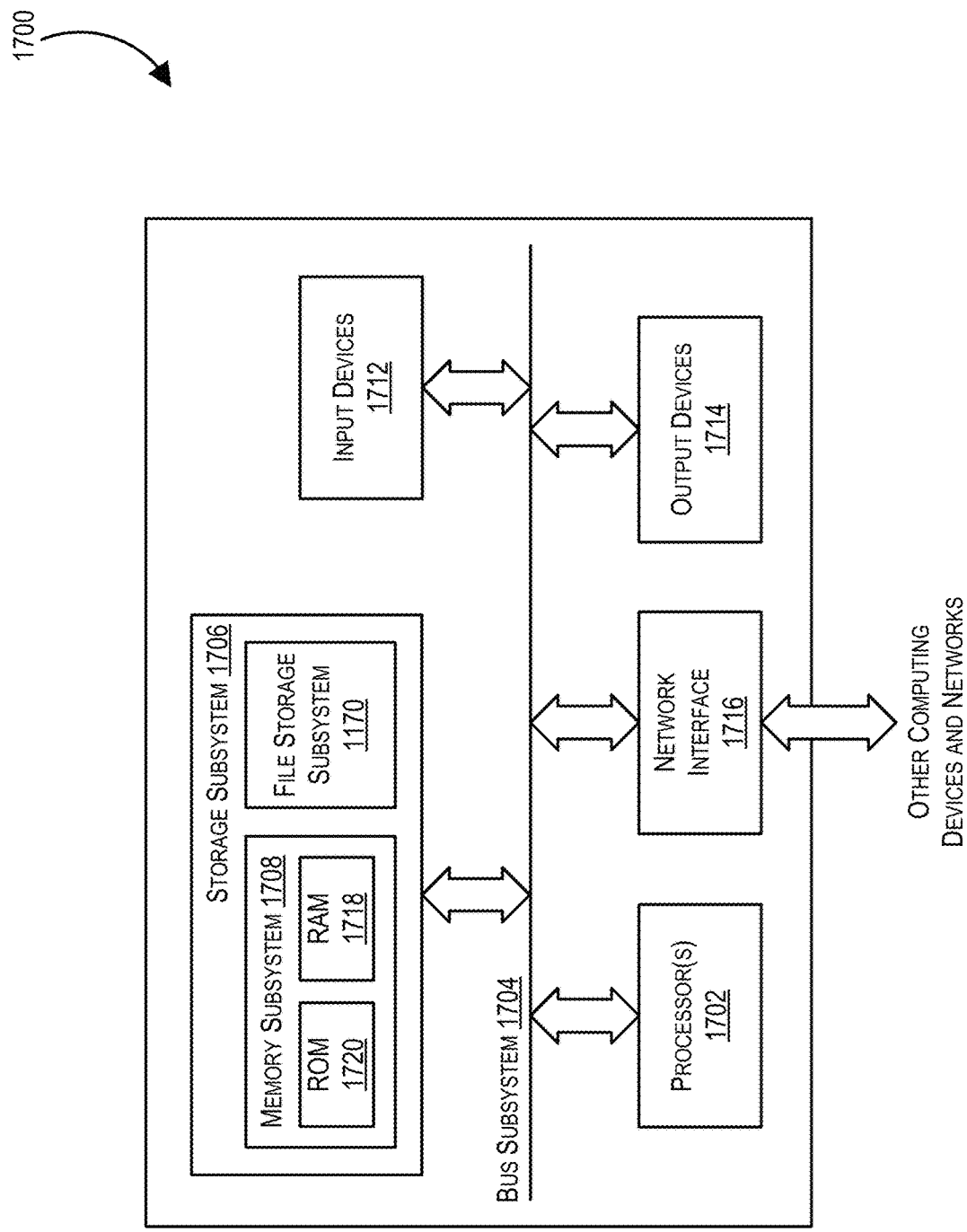
FIG. 17 illustrates a simplified block diagram of an example computer system according to one or more embodiments.

FIG. 17 depicts a simplified block diagram of an example computer system 1700 according to certain embodiments. Computer system 1700 can be used to implement any of the computing devices, systems, or servers described in the foregoing disclosure. As shown in FIG. 17, computer system 1700 includes one or more processors 1702 that communicate with a number of peripheral devices via a bus subsystem 1704. These peripheral devices include a storage subsystem 1706 (comprising a memory subsystem 1708 and a file storage subsystem 1170), user interface input devices 1712, user interface output devices 1714, and a network interface subsystem 1716.

Bus subsystem 1704 can provide a mechanism for letting the various components and subsystems of computer system 1700 communicate with each other as intended. Although bus subsystem 1704 is shown schematically as a single bus, alternative embodiments of the bus subsystem can utilize multiple busses.

Network interface subsystem 1716 can serve as an interface for communicating data between computer system 1700 and other computer systems or networks. Embodiments of network interface subsystem 1716 can include, e.g., an Ethernet card, a Wi-Fi and/or cellular adapter, a modem (telephone, satellite, cable, ISDN, etc.), digital subscriber line (DSL) units, and/or the like.

User interface input devices 1712 can include a keyboard, pointing devices (e.g., mouse, trackball, touchpad, etc.), a touch-screen incorporated into a display, audio input devices (e.g., voice recognition systems, microphones, etc.) and other types of input devices. In general, use of the term "input device" is intended to include all possible types of devices and mechanisms for inputting information into computer system 1700.

User interface output devices 1714 can include a display subsystem, a printer, or non-visual displays such as audio output devices, etc. The display subsystem can be, e.g., a flat-panel device such as a liquid crystal display (LCD) or organic light-emitting diode (OLED) display. In general, use of the term "output device" is intended to include all possible types of devices and mechanisms for outputting information from computer system 1700.

Storage subsystem 1706 includes a memory subsystem 1708 and a file/disk storage subsystem 1170. Subsystems 1718 and 1720 represent non-transitory computer-readable storage media that can store program code and/or data that provide the functionality of embodiments of the present disclosure.

Memory subsystem 1708 includes a number of memories including a main random access memory (RAM) 1718 for storage of instructions and data during program execution and a read-only memory (ROM) 1720 in which fixed instructions are stored. File storage subsystem 1170 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art. It is understood that computer system 1700 is illustrative and many other configurations having more or fewer components than system 1700 are possible.

FURTHER EXAMPLES

Each of the following non-limiting examples may stand on its own or may be combined in various permutations or combinations with one or more of the other examples.

Some embodiments herein includes a computer system comprising a communication interface; one or more processors; and a non-transitory computer readable medium storing a set of instructions. Execution of the instructions by the one or more processors causes the one or more processors to receive, over a network via the communication interface, a first set of data obtained from a first analog-to-digital converter (ADC) device; diagnose a first deficiency in operation of the first ADC device based on the first set of data; generate a set of first correction coefficients for improving operation of the first ADC device based on the first deficiency diagnosed; and transmit, over the network via the communication interface, the set of first correction coefficients to the first ADC device.

In some embodiments, execution of the program code causes the one or more control processors to receive, over the network via the communication interface, classification information regarding the first ADC device, wherein diagnosing the first deficiency of the first ADC is deficient is based on the classification information.

In some embodiments, the computer system comprises a set of neural network models trained to diagnose deficiencies in operation of ADC devices, wherein execution of the set of instructions causes the one or more processors to provide the first set of data as input to the set of neural network models, wherein the first deficiency profile is received from the one or more neural network models. In some embodiments, the set of first correction coefficients is generated by the set of neural network models based on the first set of data.

In some embodiments, the first deficiency is a nonlinearity deficiency in operation of the first ADC device and the set of first correction coefficients mitigates the nonlinearity deficiency. In some embodiments, the first deficiency is a mismatch deficiency in operation of the first ADC device and the set of first correction coefficients includes a set of interleave coefficients that mitigate the mismatch deficiency.

In some embodiments, execution of the set of instructions causes the one or more processors to generate a numerical distribution of the first set of data; generate a target numerical distribution for the first ADC device; and perform a comparison between the numerical distribution and the target numerical distribution, wherein the first deficiency is diagnosed based on a result of the comparison.

In some embodiments, execution of the program code causing the one or more control processors to receive, over a network via the communication interface, a second set of data obtained from a second ADC device that operates differently than the first ADC device; diagnose a second deficiency in operation of the second ADC device based on the second set of data; generate a set of second correction coefficients for improving operation of the second ADC device based on the second deficiency diagnosed; and transmit, over the network via the communication interface, the set of second correction coefficients to the second ADC device. In some embodiments, the first deficiency is a nonlinearity deficiency in operation of the first ADC device and the set of first correction coefficients mitigates the nonlinearity deficiency, and the second deficiency is a mismatch deficiency in operation of the second ADC device and the set of second correction coefficients includes a set of interleave coefficients that mitigate the mismatch deficiency.

Embodiments disclosed herein include a method comprising receiving, over a network via the communication interface, a set of operational data of an integrated circuit; diagnosing a deficiency in operation of the integrated circuit based on the set of operational data; generating a correction for improving operation of the integrated circuit based on the deficiency diagnosed; and transmitting, over the network via the communication interface, the correction to the integrated circuit.

In some embodiments, the method comprises providing the set of operational data to a set of neural network models, wherein the set of neural network models output the correction in response to the set of operational data.

In some embodiments, the method comprises routing the set of operational data to a correction module of a plurality of correction modules based on classification information associated with the integrated circuit, wherein the correction is received from the correction module in response to the set of operational data.

In some embodiments, the method comprises generating a numerical distribution of the set of operational data; generating a target numerical distribution for the integrated circuit; and performing a comparison between the numerical distribution and the target numerical distribution, wherein the deficiency is diagnosed based on a result of the comparison.

In some embodiments, the deficiency in operation is a nonlinearity deficiency and the correction is configured to mitigate the nonlinearity deficiency as a result of implementation in the integrated circuit. In some embodiments, the deficiency in operation is a mismatch between components of the integrated circuit and the correction is an interleave correction configured to mitigate the mismatch as a result of implementation in the integrated circuit.

Some embodiments disclosed herein include a system comprising a plurality of correction modules configured to diagnose and correct deficiencies in operation of integrated circuits; a communication interface configured to receive, over a network, data sets regarding operation of integrated circuits; and a classification module configured to route the data sets to corresponding correction modules based on classification information associated with the data sets, wherein a first correction module of the plurality of correction modules is configured to diagnose and correct operational deficiencies in a first type or architecture of integrated circuit, and a second correction module of the plurality of correction modules is configured to diagnose and correct operational deficiencies in a second type or architecture of integrated circuit.

In some embodiments, the classification module, in operation, routes a first data set associated with operation of a first integrated circuit to the first correction module based on first classification information received by the communication interface in connection with the first data set; and routes a second data set associated with operation of a second integrated circuit to the second correction module based on second classification information received by the communication interface in connection with the second data set.

In some embodiments, the first correction module diagnoses a first deficiency in operation of the first integrated circuit based on the first data set and generates a first correction for the first deficiency, and the second correction module diagnoses a second deficiency in operation of the second integrated circuit based on the second data set and generates the second correction for the second deficiency.

In some embodiments, the first correction module includes a first set of neural network models configured to diagnose and correct the operational deficiencies in the first type or architecture of integrated circuit, and the second correction module includes a second set of neural network models configured to diagnose and correct the operational deficiencies in the second type or architecture of integrated circuit.

In some embodiments, the first correction module is configured to diagnose and correct nonlinearity deficiencies in operation of the first type or architecture of integrated circuit, and is configured to diagnose and correct mismatch deficiencies in operation of the first type or architecture of integrated circuit.

In some embodiments, an analog-to-digital converter may be calibrated over a network according to an embodiment. As mentioned above, features and advantages of the present disclosure include calibration of analog-to-digital converters using algorithms running on remote servers. For example, in many applications there may be high speed connections between a device where an ADC is located and a server where more computationally intensive calibration algorithms may be executed. In this example, a device includes one or more high speed data communications receiver(s) including an ADC. ADC may include an input configured to receive an analog input signal and is configured to generate a digital output code corresponding to the analog input signal. During a calibration phase, an ADC calibration circuit communicates over network with a calibration algorithm executing on remote server. Network may be any of a variety of high speed networks (e.g., Ethernet). Calibration circuit may generate an analog input signal pattern. When the analog input signal pattern is provided on the input of the ADC in device, the calibration algorithm receives, over network, counts of the digital output codes generated by ADC in response to the analog input signal pattern. Calibration algorithm may adjust parameters of ADC, via communication with calibration circuit over network, to calibrate ADC based on the counts (e.g., based on a histogram). As mentioned above, in one example embodiment of this feature, calibration algorithm executing on the remote server detects errors in the plurality of counts and signals calibration circuit to adjust one or more comparator delays. Features and advantages of some embodiments may process count information from ADC using a machine learning algorithm executing on server to adjust parameters of ADC. For example, calibration algorithms executing on server may be configured to perform statistical analysis to calibrate ADC timing errors, mismatch in capacitors, DC offset, gain, and the like.

In one embodiment, the present disclosure includes a circuit comprising: a successive approximation register analog-to-digital converter configured to receive an analog input signal and to generate a digital output code corresponding to the analog input signal, the analog-to-digital converter including at least one comparator used to generate the digital output code, wherein the at least one comparator is coupled to a comparator clock signal; and a calibration circuit coupled to the analog-to-digital converter, the calibration circuit providing an input signal pattern to the analog-to-digital converter to generate a plurality of counts of the digital output codes across a range of analog input signal values, wherein errors in the plurality of counts are detected and used to adjust at least one delay of the comparator clock signal to reduce the errors in the plurality of counts.

In another embodiment, the present disclosure includes a method of calibrating a successive approximation register analog-to-digital converter comprising: providing an analog input signal pattern to an input of the successive approximation register analog-to-digital converter; generating, by the successive approximation register analog-to-digital converter, a plurality of digital output codes representing the analog input signal pattern; clocking at least one comparator in the successive approximation register analog-to-digital converter as part of generating the plurality of digital output codes; generating a histogram of the digital output codes; detecting errors in the digital output codes from the histogram; and adjusting at least one delay of the clocking of the at least one comparator in response to the detected errors in the histogram.

In another embodiment, the present disclosure includes a system comprising: a device comprising one or more receivers, the one or more receivers comprising an analog-to-digital converter, the analog-to-digital converter having an input configured to receive an analog input signal and configured to generate a digital output code corresponding to the analog input signal; and a server coupled to the device over a network, the server including a calibration algorithm executable on the server, wherein when an analog input signal pattern is provided on the input of the analog-to-digital converter in the device, the calibration algorithm receives, over the network, at least a plurality of counts of the digital output codes generated by the analog-to-digital converter in response to the analog input signal pattern, and wherein the calibration algorithm adjusts parameters of the analog-to-digital converter to calibrate the analog-to-digital converter based at least in part on the plurality of counts.

In one embodiment, at least one delay is adjusted when the one or more detected errors are above a threshold.

In one embodiment, at least one delay is adjusted across a plurality of iterations of providing the input signal pattern to the analog-to-digital converter to generate the plurality of counts, and wherein the at least one delay is incrementally increased on each iteration until the one or more detected errors are below the threshold.

In one embodiment, at least one delay is adjusted based on one or more of the detected errors.

In one embodiment, at least one delay is adjusted based on a difference between counts of two or more digital output codes.

In one embodiment, at least one delay is adjusted based on a count of a particular digital output code.

In one embodiment, the calibration circuit detects errors in one or more predetermined digital output codes.

In one embodiment, the calibration circuit adjusts at least one delay corresponding to a most significant bit produced by the analog-to-digital converter.

In one embodiment, the calibration circuit adjusts a plurality of delays corresponding to multiple bits produced by the analog-to-digital converter.

In one embodiment, different bits produced by the analog-to-digital converter use particular associated delays during normal operation.

In one embodiment, the plurality of counts of the digital output codes across the range of analog input signal values comprise a histogram.

In one embodiment, the input signal pattern causes the analog-to-digital converter to produce all digital output codes across the range of analog input signal values.

In one embodiment, the input signal pattern is a sine wave.

In one embodiment, the input signal pattern corresponds to a pulse amplitude modulated (PAM) input signal.

In one embodiment, the successive approximation register analog-to-digital converter comprises: a digital-to-analog converter configured to receive a digital input signal and to provide a reference voltage to the comparator, the reference voltage having a value based on the digital input signal; a clock circuit configured to generate a comparator clock signal; a variable delay circuit coupled to the clock circuit to receive the clock signal and coupled to receive a delay control signal, the variable delay circuit configured to generate a delayed clock signal having a delay based on the delay control signal; and a digital circuit configured to provide the digital input signal to the digital-to-analog converter and the delay control signal to the variable delay circuit.

In one embodiment, the digital-to-analog converter comprises a capacitive digital-to-analog converter.

In one embodiment, the circuit comprises a plurality of said analog-to-digital converters each including the at least one comparator, and wherein the plurality of the analog-to-digital converters are configured in parallel.

In one embodiment, the successive approximation register analog-to-digital converter comprises a plurality of comparators equal to a number of bits of the digital output code, and wherein the calibration circuit is configured to generate a separate delay control signal to adjust a separate delay of each of a plurality of comparator clock signals applied to the plurality of comparators.

In one embodiment, the calibration circuit communicates with a calibration algorithm executing on a remote server, and wherein the calibration algorithm executing on the remote server detects errors in the plurality of counts and signals the calibration circuit to adjust the at least one delay.

In another embodiment, the present disclosure includes a method of calibrating an analog-to-digital converter comprising: providing an analog input signal pattern to an input of a successive approximation register analog-to-digital converter; generating by the successive approximation register analog-to-digital converter a plurality of digital output codes representing the analog input signal pattern; clocking at least one comparator in the successive approximation register analog-to-digital converter as part of generating the plurality of digital output codes; generating a histogram of the digital output codes generated by the successive approximation register analog-to-digital converter; detecting errors in the digital output codes from the histogram; and adjusting at least one delay of the clocking of the at least one comparator in response to the detected errors in the histogram.

In another embodiment, the present disclosure includes a system comprising: a device comprising one or more receivers, the one or more receivers comprising an analog-to-digital converter, the analog-to-digital converter having an input configured to receive an analog input signal and configured to generate a digital output code corresponding to the analog input signal; and a server coupled to the device over a network, the server including a calibration algorithm executable on the server, wherein when an analog input signal pattern is provided on the input of the analog-to-digital converter in the device, the calibration algorithm receives, over the network, at least a plurality of counts of the digital output codes generated by the analog-to-digital converter in response to the analog input signal pattern, and wherein the calibration algorithm adjusts parameters of the analog-to-digital converter to calibrate the analog-to-digital converter based at least in part on the plurality of counts.

The above description illustrates various embodiments of the present disclosure along with examples of how aspects of these embodiments may be implemented. The above examples and embodiments should not be deemed to be the only embodiments, and are presented to illustrate the flexibility and advantages of the present disclosure as defined by the following claims. For example, although certain embodiments have been described with respect to particular process flows and steps, it should be apparent to those skilled in the art that the scope of the present disclosure is not strictly limited to the described flows and steps. Steps described as sequential may be executed in parallel, order of steps may be varied, and steps may be modified, combined, added, or omitted. As another example, although certain embodiments have been described using a particular combination of hardware and software, it should be recognized that other combinations of hardware and software are possible, and that specific operations described as being implemented in software can also be implemented in hardware and vice versa.

The specification and drawings are, accordingly, to be regarded in an illustrative rather than restrictive sense. Other arrangements, embodiments, implementations, and equivalents will be evident to those skilled in the art and may be employed without departing from the spirit and scope of the present disclosure as set forth in the following claims.

What is claimed is:

1. A computer system comprising:
a communication interface;
one or more processors; and
a non-transitory computer readable medium storing a set of instructions that, as a result of execution by the one or more processors, causes the one or more processors to:
receive, over a network via the communication interface, a first set of data obtained from a first analog-to-digital converter (ADC) device;
diagnose a first deficiency in operation of the first ADC device based on the first set of data;
generate a set of first correction coefficients for improving operation of the first ADC device based on the first deficiency diagnosed;
transmit, over the network via the communication interface, the set of first correction coefficients to the first ADC device;
receive, over the network via the communication interface, a second set of data obtained from a second ADC device that operates differently than the first ADC device;
diagnose a second deficiency in operation of the second ADC device based on the second set of data;
generate a set of second correction coefficients for improving operation of the second ADC device based on the second deficiency diagnosed; and
transmit, over the network via the communication interface, the set of second correction coefficients to the second ADC device.

2. The computer system of claim 1, execution of the program code causing the one or more control processors to:
receive, over the network via the communication interface, classification information regarding the first ADC device, wherein diagnosing the first deficiency of the first ADC is deficient is based on the classification information.

3. The computer system of claim 1, the computer system comprising:
a set of neural network models trained to diagnose deficiencies in operation of ADC devices, wherein execution of the set of instructions causes the one or more processors to:

provide the first set of data as input to the set of neural network models, wherein the first deficiency profile is received from the one or more neural network models.

4. The computer system of claim 3, wherein the set of first correction coefficients is generated by the set of neural network models based on the first set of data.

5. The computer system of claim 1, wherein the first deficiency is a nonlinearity deficiency in operation of the first ADC device and the set of first correction coefficients mitigates the nonlinearity deficiency.

6. The computer system of claim 1, wherein the first deficiency is a mismatch deficiency in operation of the first ADC device and the set of first correction coefficients includes a set of interleave coefficients that mitigate the mismatch deficiency.

7. The computer system of claim 1, wherein execution of the set of instructions causes the one or more processors to:
generate a numerical distribution of the first set of data;
generate a target numerical distribution for the first ADC device; and
perform a comparison between the numerical distribution and the target numerical distribution, wherein the first deficiency is diagnosed based on a result of the comparison.

8. The computer system of claim 1, wherein the first deficiency is a nonlinearity deficiency in operation of the first ADC device and the set of first correction coefficients mitigates the nonlinearity deficiency, and the second deficiency is a mismatch deficiency in operation of the second ADC device and the set of second correction coefficients includes a set of interleave coefficients that mitigate the mismatch deficiency.

9. A system, comprising:
a plurality of correction modules configured to diagnose and correct deficiencies in operation of integrated circuits;
a communication interface configured to receive, over a network, data sets regarding operation of integrated circuits; and
a classification module configured to route the data sets to corresponding correction modules based on classification information associated with the data sets,
wherein a first correction module of the plurality of correction modules is configured to diagnose and correct operational deficiencies in a first type or architecture of integrated circuit, and a second correction module of the plurality of correction modules is configured to diagnose and correct operational deficiencies in a second type or architecture of integrated circuit.

10. The system of claim 9, wherein the classification module, in operation:
routes a first data set associated with operation of a first integrated circuit to the first correction module based on first classification information received by the communication interface in connection with the first data set; and
routes a second data set associated with operation of a second integrated circuit to the second correction module based on second classification information received by the communication interface in connection with the second data set.

11. The system of claim 9, wherein, in operation, the first correction module diagnoses a first deficiency in operation of the first integrated circuit based on the first data set and generates a first correction for the first deficiency, and the second correction module diagnoses a second deficiency in operation of the second integrated circuit based on the second data set and generates the second correction for the second deficiency.

12. The system of claim 9, wherein the first correction module includes a first set of neural network models configured to diagnose and correct the operational deficiencies in the first type or architecture of integrated circuit, and the second correction module includes a second set of neural network models configured to diagnose and correct the operational deficiencies in the second type or architecture of integrated circuit.

13. The system of claim 9, wherein the first correction module is configured to diagnose and correct nonlinearity deficiencies in operation of the first type or architecture of integrated circuit, and is configured to diagnose and correct mismatch deficiencies in operation of the first type or architecture of integrated circuit.

* * * * *